US012641873B2

(12) United States Patent
Huang et al.

(10) Patent No.: US 12,641,873 B2
(45) Date of Patent: May 26, 2026

(54) INTEGRATED CIRCUIT STRUCTURE AND METHOD FOR FABRICATING THE SAME

(71) Applicant: TAIWAN SEMICONDUCTOR MANUFACTURING COMPANY, LTD., Hsinchu (TW)

(72) Inventors: Yu-Xuan Huang, Hsinchu (TW); Chi-Yu Lu, New Taipei (TW); Shang-Wen Chang, Hsinchu County (TW); Guan-Lin Chen, Hsinchu County (TW); Cheng-Chi Chuang, New Taipei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 457 days.

(21) Appl. No.: 18/187,989

(22) Filed: Mar. 22, 2023

(65) Prior Publication Data

US 2024/0321881 A1     Sep. 26, 2024

(51) Int. Cl.
| | |
|---|---|
| *H10D 84/85* | (2025.01) |
| *H01L 23/528* | (2006.01) |
| *H10D 30/01* | (2025.01) |
| *H10D 30/63* | (2025.01) |
| *H10D 64/01* | (2025.01) |

(52) U.S. Cl.
CPC ......... *H10D 84/85* (2025.01); *H01L 23/5286* (2013.01); *H10D 30/025* (2025.01); *H10D 30/63* (2025.01); *H10D 64/01* (2025.01); *H10D 64/015* (2025.01)

(58) Field of Classification Search
CPC ...... H10D 84/85; H10D 30/025; H10D 30/63; H10D 64/01; H10D 64/015; H10D 62/151; H10D 64/017; H10D 84/0149; H10D 84/0186; H10D 84/038; H10D 84/837; H01L 23/5286
See application file for complete search history.

(56) References Cited

U.S. PATENT DOCUMENTS

| | | | |
|---|---|---|---|
| 2021/0305393 A1* | 9/2021 | Wang | H01L 21/02532 |
| 2022/0013410 A1* | 1/2022 | You | H10D 62/121 |
| 2022/0199630 A1* | 6/2022 | Ye | H10D 30/6735 |
| 2023/0395681 A1* | 12/2023 | Liu | H10D 30/014 |

* cited by examiner

*Primary Examiner* — Yasser A Abdelaziez
(74) *Attorney, Agent, or Firm* — Birch, Stewart, Kolasch & Birch, LLP

(57) ABSTRACT

A method includes forming an epitaxial stack including a first sacrificial layer, a channel layer, and a second sacrificial layer over a semiconductor substrate; patterning the epitaxial stack into a fin structure such that opposite first ends of the channel layer are exposed; recessing the opposite first ends of the channel layer; forming first dummy spacers on the recessed opposite first ends of the channel layer; forming an isolation structure in the fin structure; recessing a top surface of the isolation structure to a position lower than a bottom surface of the channel layer, such that opposite second ends of the channel layer are exposed; recessing the opposite second ends of the channel layer; forming second dummy spacers on the recessed opposite second ends of the channel layer; and replacing the first dummy spacers and the second dummy spacers with a metal gate structure.

20 Claims, 42 Drawing Sheets

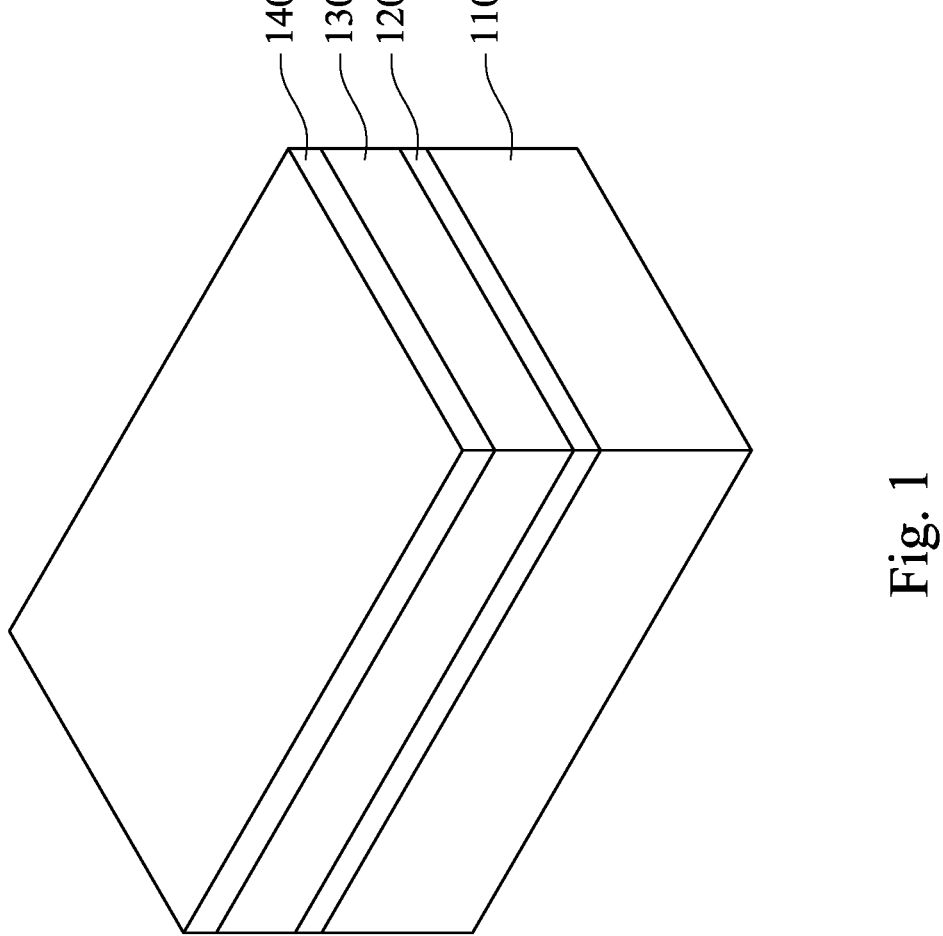
140
130
120
110
Fig. 1
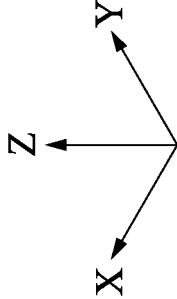

110

150
142
132
122
112

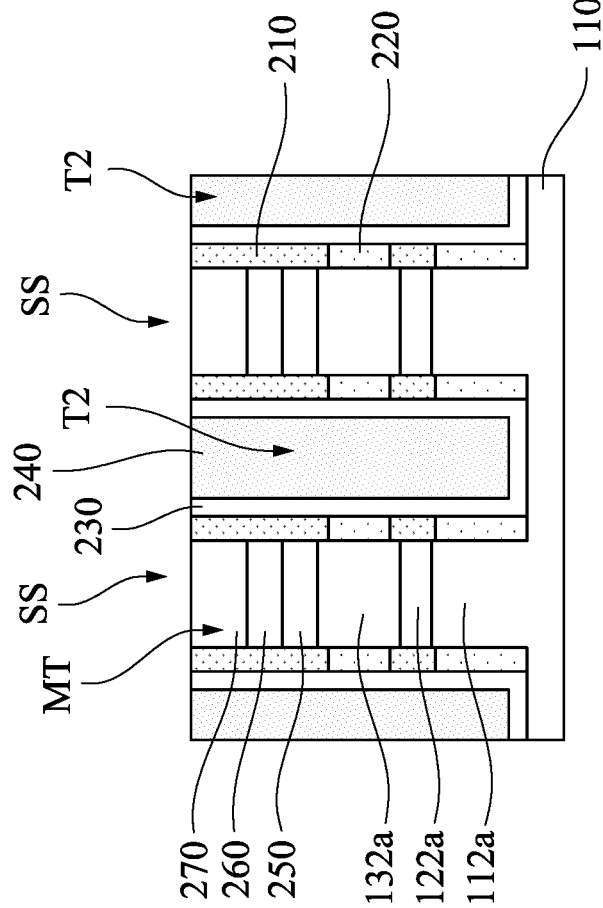
Fig. 11B
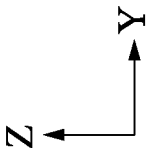

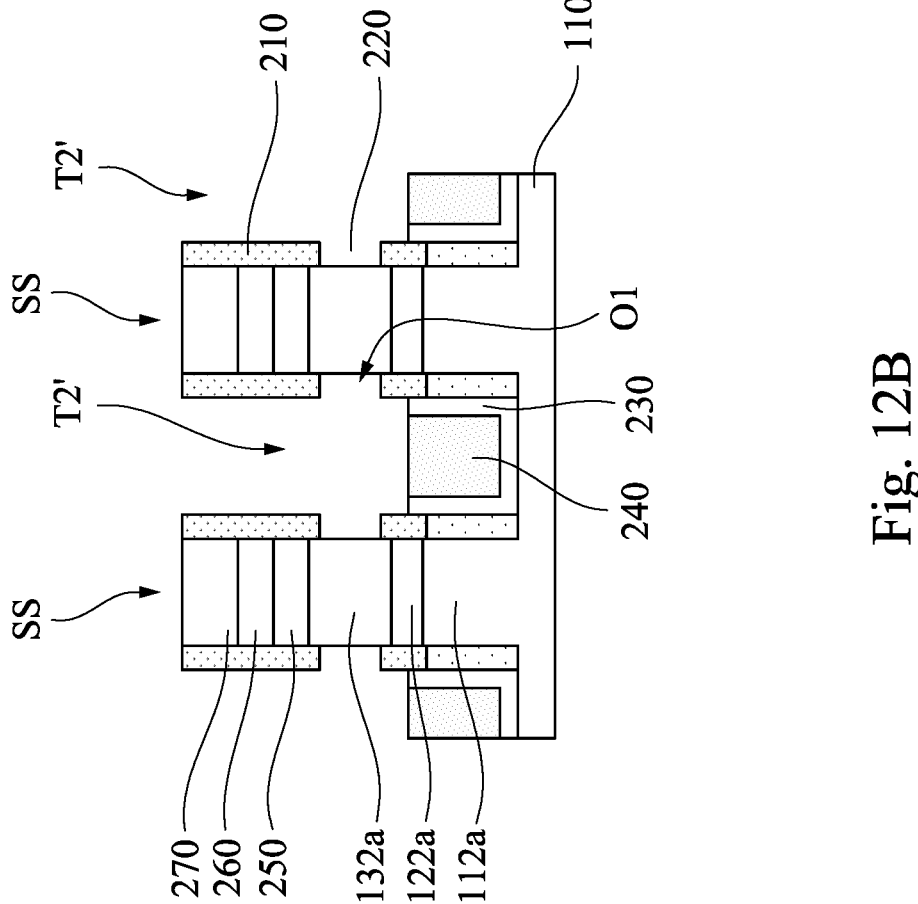
Fig. 12B
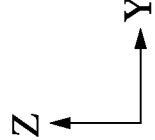

INTEGRATED CIRCUIT STRUCTURE AND METHOD FOR FABRICATING THE SAME

BACKGROUND

Semiconductor devices are used in a variety of electronic applications, such as personal computers, cell phones, digital cameras, and other electronic equipment, as examples. Semiconductor devices are fabricated by sequentially depositing various insulating or dielectric layers, conductive layers, and semiconductive layers of material over a semiconductor substrate, and patterning the various material layers using lithography to form circuit components and elements thereon. Dozens or hundreds of integrated circuits are typically manufactured on a single semiconductor wafer. The individual dies are singulated by sawing the integrated circuits along a scribe line. The individual dies are then packaged separately, in multi-chip modules, or in other types of packaging, for example.

The semiconductor industry continues to improve the integration density of various electronic components (e.g., transistors, diodes, resistors, capacitors, etc.) by continual reductions in minimum feature size, which allow more components to be integrated into a given area. These denser and smaller electronic components require more advanced packaging systems.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1-17C illustrate perspective views, cross-sectional views, and plan top views of intermediate stages in formation of an integrated circuit structure having vertical field-effect transistor (VFET), in accordance with some embodiments of the present disclosure.

FIG. 23B is a top-side layout of the AOI22D1 circuit of FIG. 23A.

FIG. 23C is a bottom-side layout of the AOI22D1 circuit of FIG. 23A.

DETAILED DESCRIPTION

Figure 2:
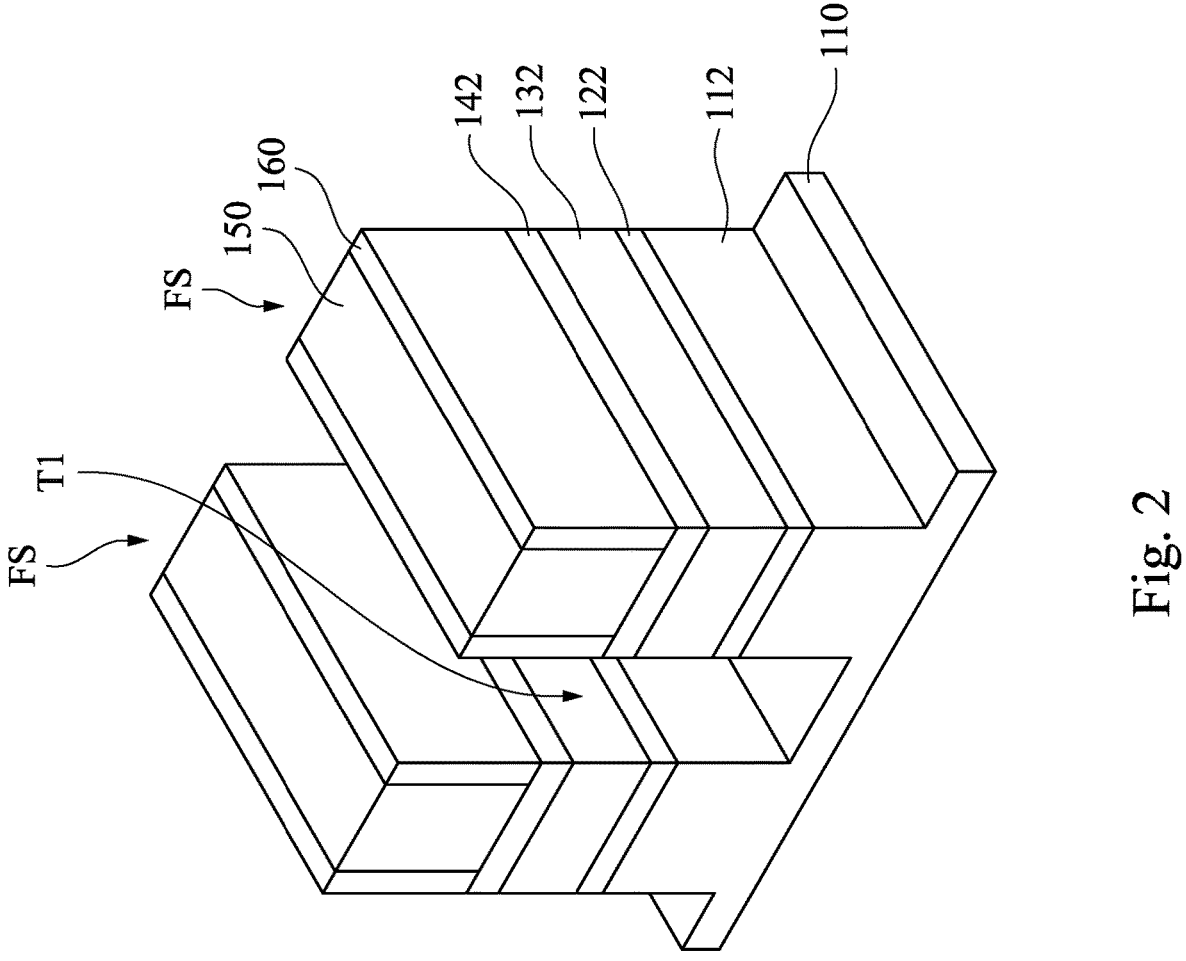
Figure 2:
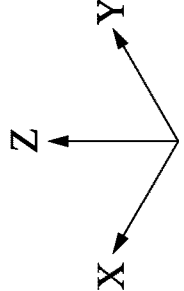

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. As used herein, "around," "about," "approximately," or "substantially" shall generally mean within 20 percent, or within 10 percent, or within 5 percent of a given value or range. Numerical quantities given herein are approximate, meaning that the term "around," "about," "approximately," or "substantially" can be inferred if not expressly stated.

FIGS. 1-17C illustrate perspective views, cross-sectional views, and plan top views of intermediate stages in formation of an integrated circuit structure having vertical field-effect transistor (VFET), in accordance with some embodiments of the present disclosure. It is understood that additional steps may be provided before, during, and after the steps shown by FIGS. 1-17C, and some of the steps described below can be replaced or eliminated for additional embodiments of the method. The order of the operations/processes may be interchangeable.

FIGS. 1, 2, 3, 4, 5, 6A, 10A, 11A, 12A, 13A, 14A, 15A, 16, and 17A are perspective views of intermediate stages in the fabricating the integrated circuit structure in accordance with some embodiments of the present disclosure. FIGS. 6B, 7-9, 10B, 11B, 12B, 13B, 14B, 15B, and 17B are cross-sectional views of the integrated circuit structure taken along a first cut (e.g., cut B-B in FIGS. 6A/6C, 10A/10C, 11A/11C, 12A/12C, 13A/13C, 14A/14C, 15A/15C, and 17A/17C). FIGS. 6C, 10C, 11C, 12C, 13C, 14C, 15C, and 17C are plan top views of the integrated circuit structure taken along a second cut (e.g., cut C-C in FIGS. 6A, 10A, 11A, 12A, 13A, 14A, 15A, and 17A).

As with the other method embodiments and exemplary devices discussed herein, it is understood that parts of the integrated circuit structure may be fabricated by a CMOS technology process flow, and thus some processes are only briefly described herein. Further, the exemplary integrated circuit structure may include various other devices and features, such as other types of devices such as additional transistors, bipolar junction transistors, resistors, capacitors, inductors, diodes, fuses, static random access memory (SRAM) and/or other logic circuits, etc., but is simplified for a better understanding of the concepts of the present disclosure. In some embodiments, the exemplary integrated circuit structure includes a plurality of semiconductor devices (e.g., transistors), including PFETs, NVFETs, etc., which may be interconnected.

FIG. 1 shows an initial structure. The initial structure includes a substrate 110. In some embodiments, the substrate 110 may include silicon (Si). Alternatively, the substrate 110 may include germanium (Ge), silicon germanium (SiGe), a III-V material (e.g., GaAs, GaP, GaAsP, AlInAs, AlGaAs, GaInAs, InAs, GaInP, InP, InSb, and/or GaInAsP; or a combination thereof) or other appropriate semiconductor materials. In some embodiments, the substrate 110 may include a semiconductor-on-insulator (SOI) structure such as a buried dielectric layer.

An epitaxial stack including epitaxial layers 120, 130, and 140 is formed over the substrate 110 in a sequence. The epitaxial layers 120 and 140 may include a first composition, and the epitaxial layer 130 may include a second composition different from the first composition. In some embodiments, the epitaxial layers 120 and 140 are SiGe and the epitaxial layer 130 is silicon (Si). However, other embodiments are possible including those that provide for a first composition and a second composition having different oxidation rates and/or etch selectivity.

The epitaxial layer 130 may form channel(s) of the VFET. The epitaxial layers 120 and 140 may eventually be removed in source/drain formation step. Accordingly, the epitaxial layers 120 and 140 may also be referred to as sacrificial layers, and epitaxial layers 124 may also be referred to as channel layers.

By way of example, epitaxial growth of the layers of the epitaxial layers 120-140 may be performed by a molecular beam epitaxy (MBE) process, a metalorganic chemical vapor deposition (MOCVD) process, and/or other suitable epitaxial growth processes. In some embodiments, the epitaxially grown layers such as, the epitaxial layers 130 include the same material as the substrate 110. In some embodiments, the epitaxially grown layers 120 and 140 include a different material than the substrate 110. As stated above, in at least some examples, the epitaxial layers 120 and 140 include an epitaxially grown silicon germanium (SiGe) layer and the epitaxial layers 130 include an epitaxially grown silicon (Si) layer. Alternatively, in some embodiments, either of the epitaxial layers 120 and 140 may include other materials such as germanium, a compound semiconductor such as silicon carbide, gallium arsenide, gallium phosphide, indium phosphide, indium arsenide, and/or indium antimonide, an alloy semiconductor such as SiGe, GaAsP, AlInAs, AlGaAs, InGaAs, GaInP, and/or GaInAsP, or combinations thereof. As discussed, the materials of the epitaxial layers 120 and 140 may be chosen based on providing differing oxidation and/or etching selectivity properties. In some embodiments, the epitaxial layers 120, 130, and 140 are substantially dopant-free (i.e., having an extrinsic dopant concentration from about 0 $cm^{-3}$ to about $1 \times 10^{18}$ $cm^{-3}$), where for example, no intentional doping is performed during the epitaxial growth process.

Reference is made to FIG. 2. The epitaxial layers 120, 130, and 140 (referring to FIG. 1) and the substrate 110 are patterned to form fin structures FS. Each of the fin structures FS include a substrate portion 112 patterned from the substrate 110 and epitaxial layers 122-124 respectively patterned from the epitaxial layers 120-140 (referring to FIG. 1).

The patterning process may include forming hard masks 150 over the epitaxial layer 140 (referring to FIG. 1), forming spacers 160 on opposite sidewalls of the hard masks 150, and then etching the epitaxial layers 120, 130, and 140 (referring to FIG. 1) and the substrate 110 by using the hard masks 150 and the spacers 160 as etch mask. After the etching process, portions of the epitaxial layers 120, 130, and 14 and the substrate 1200 (referring to FIG. 1) uncovered by the hard masks 150 and the spacers 160 are removed. Remaining portions of the epitaxial layers 120, 130, and 140 (referring to FIG. 1) and the substrate 120 form the fin structures FS. Etching the epitaxial layers 120, 130, and 140 and the substrate 120 (referring to FIG. 1) may result in trenches T1 between neighboring fin structures FS.

The hard masks 150 may include a suitable dielectric material, such as silicon nitride, silicon oxynitride, silicon oxide, silicon carbide, high-k dielectric, the like, or the combination thereof. In some embodiments, the hard masks 150 comprises a first-type dielectric material. Formation of the hard masks 150 may include depositing a hard mask layer over the epitaxial layer 140 (referring to FIG. 1), and patterning the hard mask layer by suitable photolithography and etching processes. For example, the patterning process may include forming a photoresist over the hard mask layer by photolithography process, and etching away portions of the hard mask layer uncovered by the photoresist. Remaining portions of the hard mask layer form the hard masks 150. The photolithography process may include coating a photoresist layer (not shown), exposing the photoresist layer to a pattern, performing post-exposure bake processes, and developing the photoresist layer to form a patterned photoresist mask.

The spacers 160 may include suitable a suitable dielectric material, such as silicon nitride, silicon oxynitride, silicon oxide, silicon carbide, the like, or the combination thereof. In some embodiments, the spacers 160 comprises a second-type dielectric material different from the first-type dielectric material of the hard masks 150. The spacers 160 can be a single-layered or a multi-layered structure. Formation of the spacers 160 may include depositing a spacer layer over the hard masks 150 and the epitaxial layer 140 (referring to FIG. 1), and patterning the spacer layer into the spacers 160 by suitable anisotropic etching process.

Figure 3:
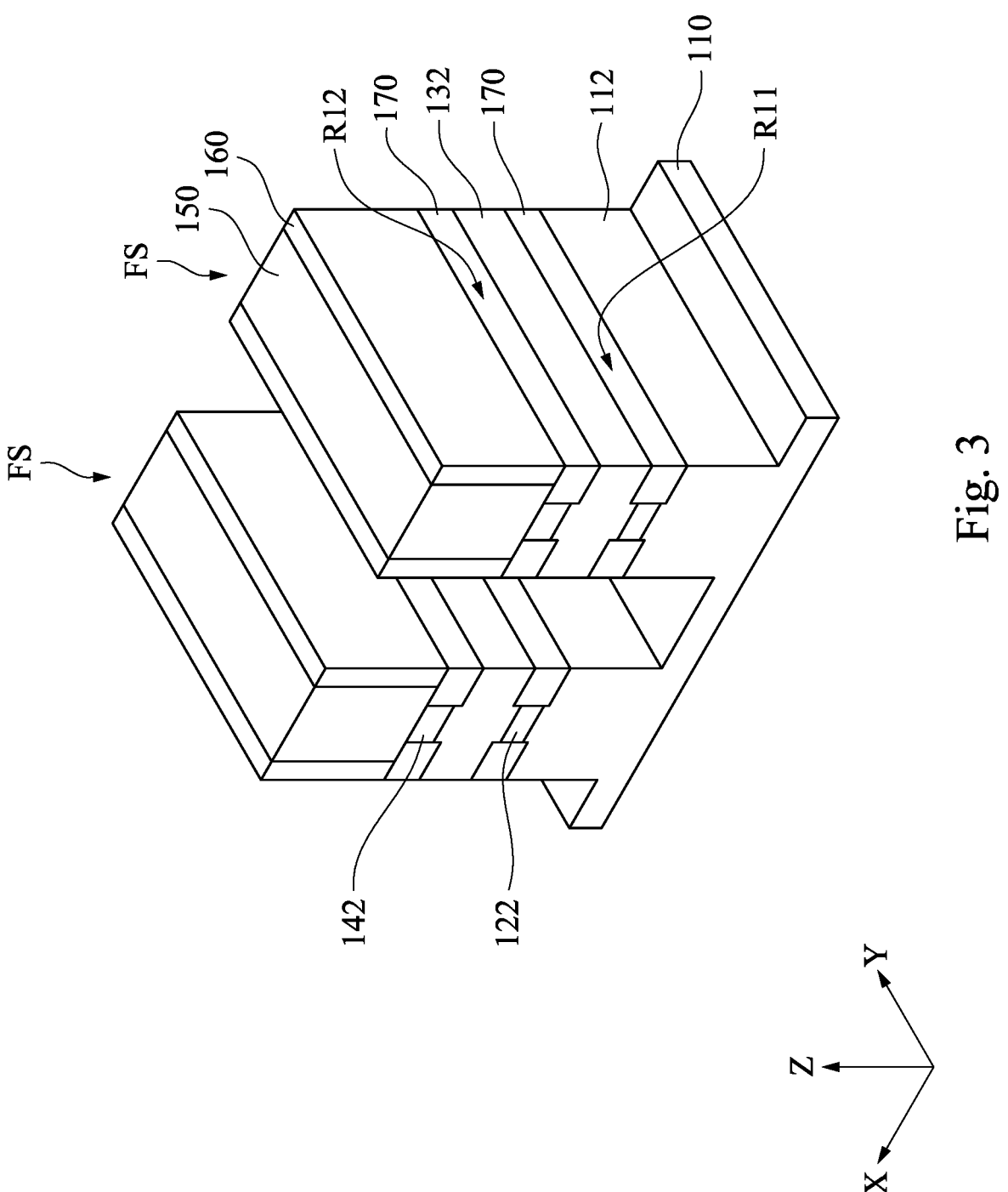

Reference is made to FIG. 3. The sacrificial layers 122 and 142 may be trimmed. For example, opposite ends of the sacrificial layers 122 and 142 exposed by the trench T1 are recessed, and inner spacers 170 are formed on the recessed opposite ends of the sacrificial layers 122 and 142.

The sacrificial layers 122 and 142 may be laterally or horizontally recessed by using suitable etch techniques, resulting in lateral recesses R11 vertically between the Si channel layer 132 and the Si substrate portion 112 and recesses R12 vertically between the Si channel layer 132 and the combination of the hard mask and the spacer 160. This step may be performed by using a selective etching process. By way of example and not limitation, the sacrificial layers 122 and 142 are SiGe and the channel layers 132 and the substrate portion 112 are silicon allowing for the selective etching of the sacrificial layers 122 and 142. In some embodiments, the selective wet etching includes an APM etch (e.g., ammonia hydroxide-hydrogen peroxide-water mixture) that etches SiGe at a faster etch rate than it etches Si. In some embodiments, the selective etching includes SiGe oxidation followed by a $SiGeO_x$ removal. For example, the oxidation may be provided by $O_3$ clean and then $SiGeO_x$ removed by an etchant such as $NH_4OH$ that selectively etches $SiGeO_x$ at a faster etch rate than it etches Si. Moreover, because oxidation rate of Si is much lower (sometimes 30 times lower) than oxidation rate of SiGe, the channel layers 132 remain substantially intact during laterally recessing the sacrificial layers 122 and 142. As a result, the channel layers 132 laterally extend past opposite end surfaces of the sacrificial layers 122 and 142 along the direction Y. The hard masks 150 and the spacers 160 may have a high etch resistance to the etch step than that of the epitaxial layers 122-142 and the substrate portion 112.

After the sacrificial layers 122 and 142 have been laterally recessed, an inner spacer material layer is formed to fill the recesses R11 and R12 left by the lateral etching of the sacrificial layers 122 and 142. The inner spacer material layer may be a suitable dielectric material, such as $SiO_2$, SiN, SiCN, or SiOCN, low-k dielectrics, and may be formed by a suitable deposition method, such as ALD, CVD, or the combination thereof. In some embodiments, the inner spacer material layer comprises a third-type dielectric material (e.g., low-k dielectrics). After the deposition of the inner spacer material layer, an anisotropic etching process may be performed to trim the deposited inner spacer material, such that only portions of the deposited inner spacer material that fill the recesses R11 and R12 left by the lateral etching of the sacrificial layers 122 and 142 are left. After the trimming process, the remaining portions of the deposited inner spacer material are denoted as inner spacers 170. The inner spacers 170 serve to isolate metal gates from source/drain epitaxial structures formed in subsequent processing. In some embodiments, sidewalls of the inner spacers 170 may be vertically aligned with sidewalls of the channel layers 132.

In some embodiments, the etch technique for forming the recesses R11 and R12 may consume top and bottom portions of the channel layer 132 adjacent to the recesses R11 and R12 and top portions of the substate portion 112 adjacent to the recesses R21, such that a height of the recesses R11 and R12 is greater than the corresponding sacrificial layers 122 and 142. As a result, a height of the inner spacers 170 can be greater than heights of the corresponding sacrificial layers 122 and 142. In some alternative embodiments, the top and bottom portions of the channel layer 132 and top portions of the substate portion 112 may not substantially consumed, and a height of the inner spacers 170 can be equal to heights of the corresponding sacrificial layers 122 and 142.

Figure 4:
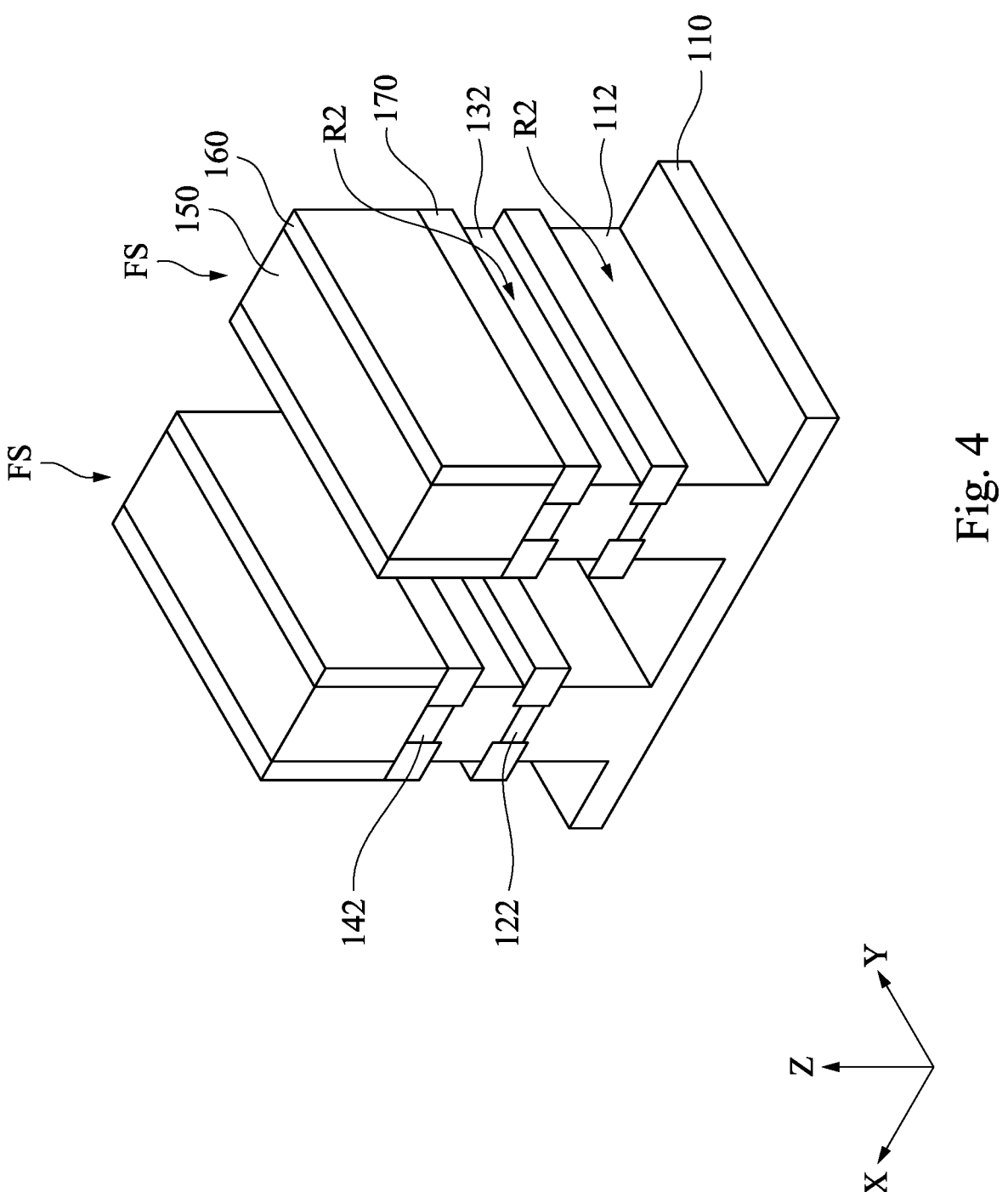

Reference is made to FIG. 4. Opposite ends of the channel layers 132 and the substate portion 112 exposed by the trench T1 may be laterally or horizontally recessed by using suitable etch techniques, resulting in lateral recesses R2. The etch process can be a wet etch, dry etch, or the combination thereof. The etch process may etch the channel layers 132 and the substate portion 112 at a faster rate than it etches the hard masks 150, the spacers 160, and the spacers 170. Thus, recesses R2 can be formed between the spacers 170 or under the spacers 170.

Figure 5:
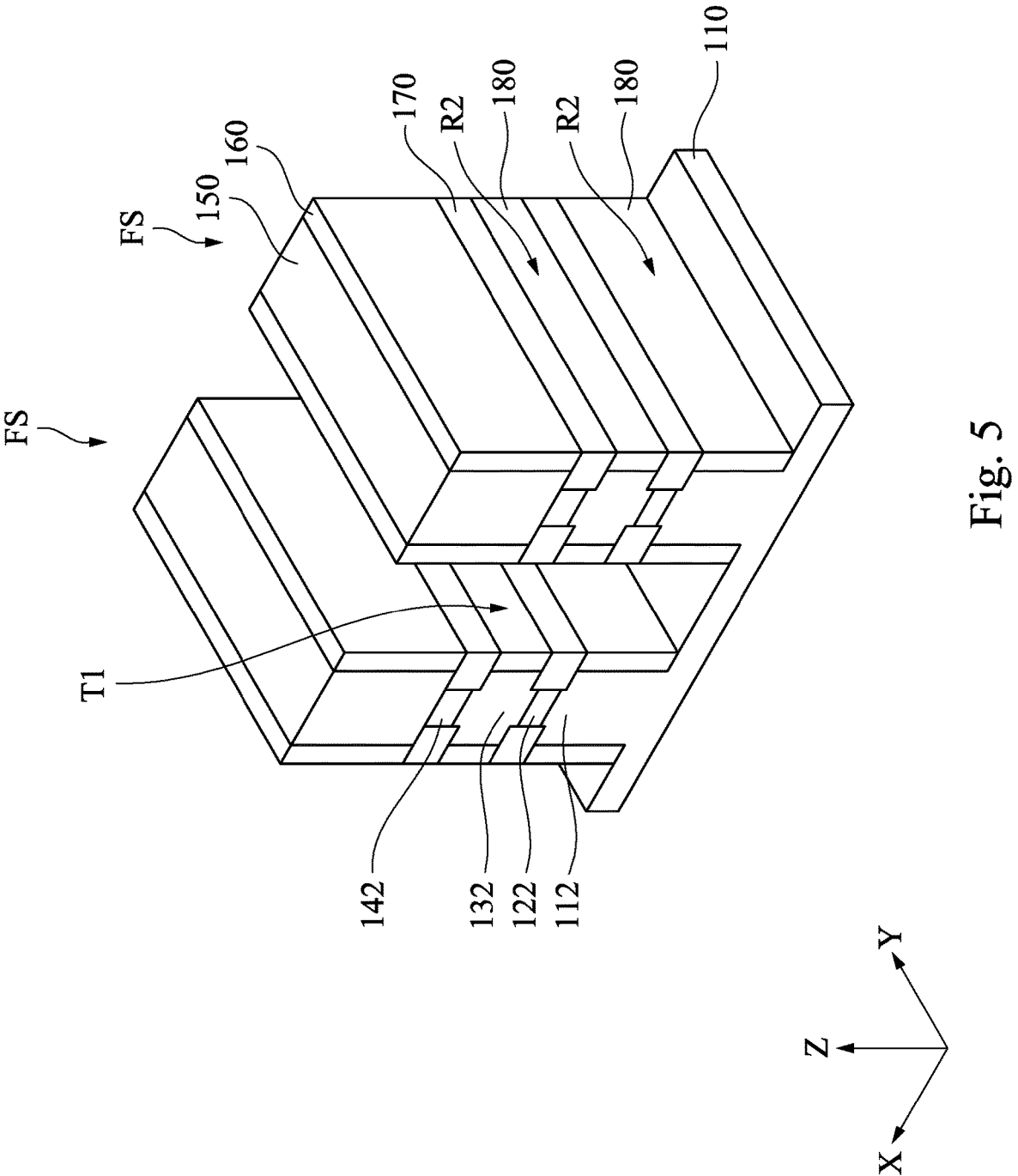

Reference is made to FIG. 5. Spacers 180 are formed on the recessed opposite ends of the channel layers 132 and the substate portion 112. The spacers 180 on opposite sides of the channel layers 132 will be replaced with metal gates in subsequent processing, and thus the spacers 180 can also be referred to as dummy spacers. After the channel layers 132 have been laterally recessed, a dummy spacer material layer is formed to fill the recesses R2 left by the lateral etching of the channel layers 132 and the substate portion 112. The dummy spacer material layer may be a suitable dielectric material, such as $SiO_2$, SiN, SiCN, or SiOCN, and may be formed by a suitable deposition method, such as ALD, CVD, or the combination thereof. In some embodiments, the dummy spacer material layer comprises a fourth-type dielectric material. After the deposition of the dummy spacer material layer, an anisotropic etching process may be performed to trim the deposited dummy spacer material, such that only portions of the deposited dummy spacer material that fill the recesses R2 left by the lateral etching of the channel layers 130 and the substate portion 112 are left. In some embodiments, sidewalls of the dummy spacers 180 may be vertically aligned with sidewalls of the inner spacers 170. In some embodiments, an etch time for the recesses R2 (referring to FIG. 4) may be controlled such that the sacrificial layers 122 and 142 are not exposed by the recesses R2. As a result, a width of the dummy spacers 180 measured along the direction Y may be less than a width of the inner spacers 170 measured along the direction Y.

In the context, the first-type to fourth-type dielectric materials are different from each other. Stated differently, each of the hard mask 150, the spacer 160, the inner spacer 170, and the dummy spacers 180 comprises dielectric material different from each other. The configuration of different materials allows selective etching processes during fabrication process. In some embodiments, a nitride concentration of the third-type dielectric material is greater than a nitride concentration of the fourth-type dielectric material. In some embodiments, an oxygen concentration of the fourth-type dielectric material is greater than an oxygen concentration of the third-type dielectric material.

Figure 6A:
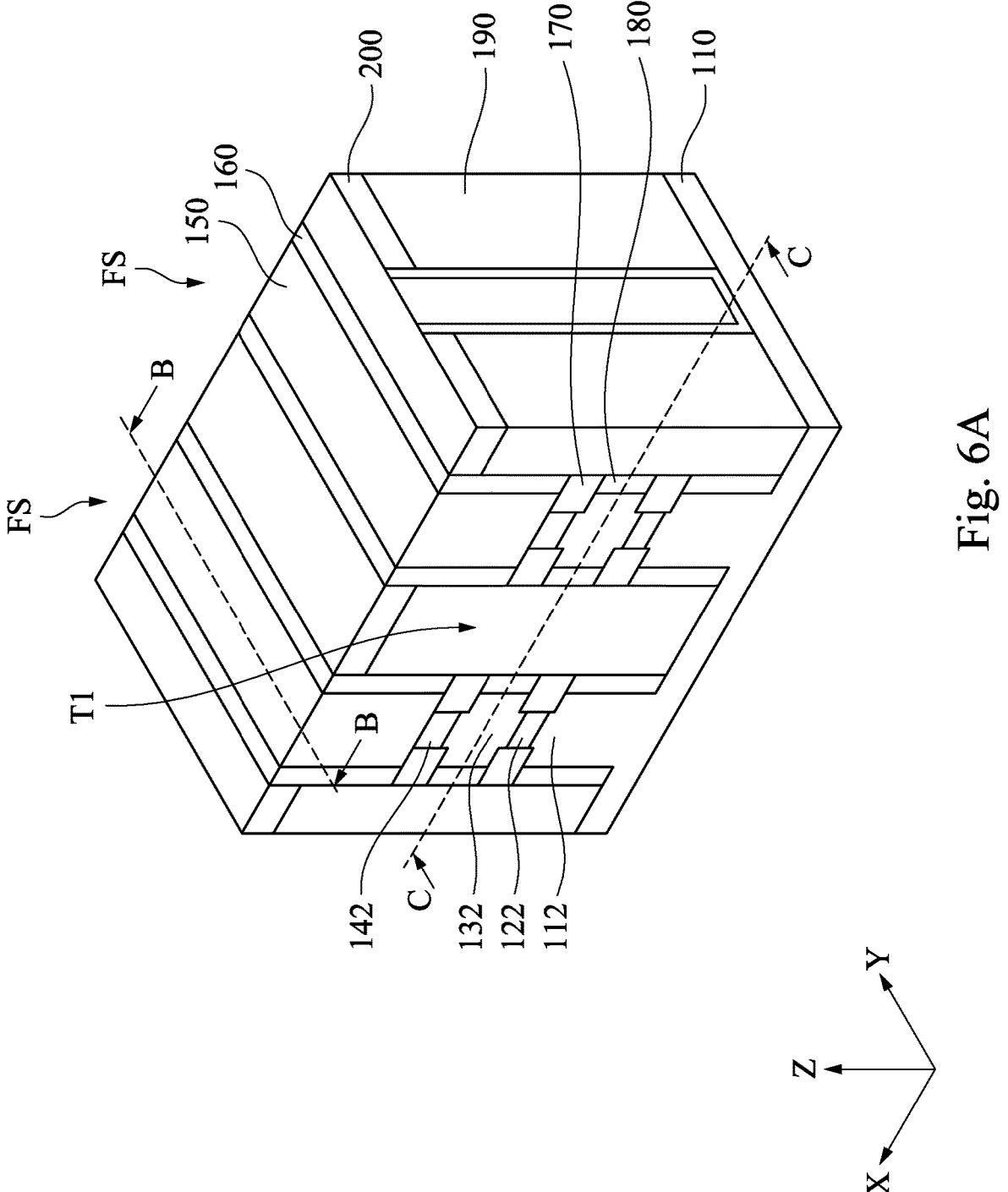
Figure 6B:
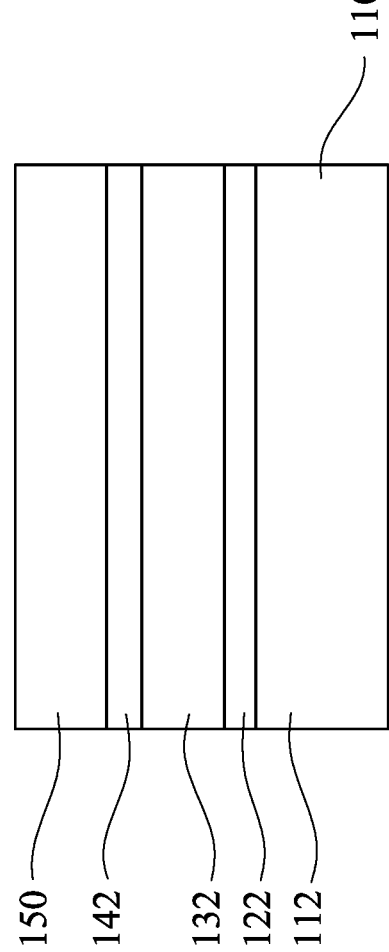
Figure 6B:
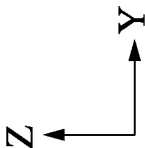
Figure 6C:
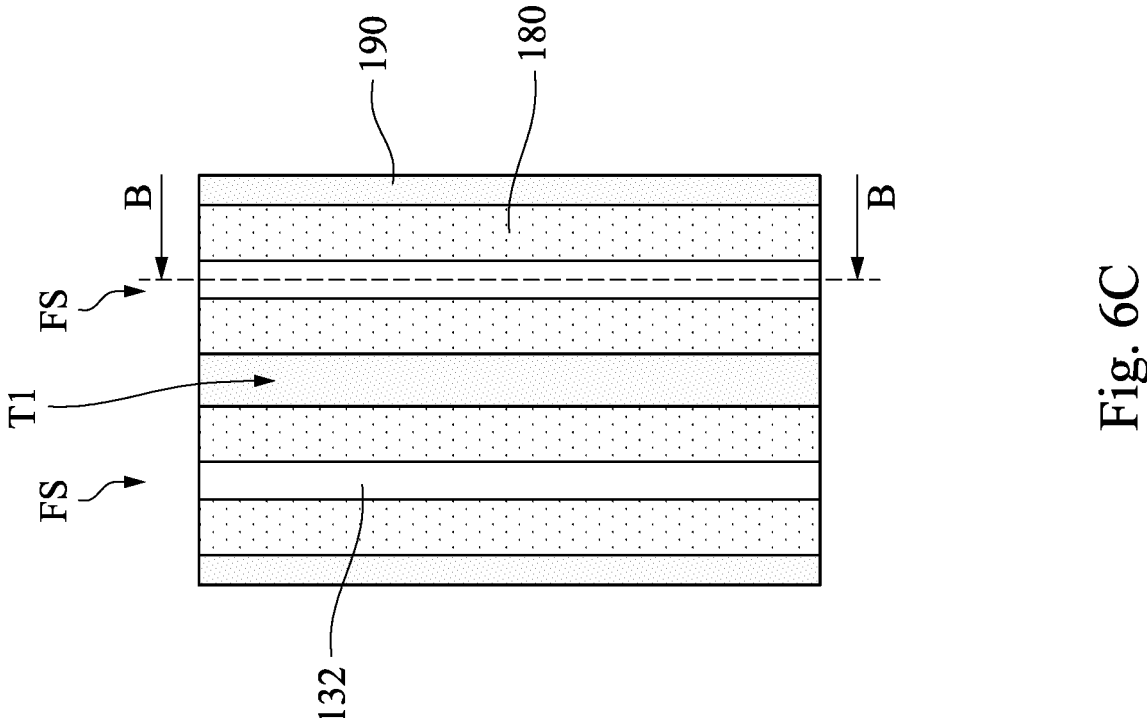

Reference is made to FIGS. 6A-6C. Trench isolation structures 190 are formed in the trenches T1 between the fin structures FS. By way of example and not limitation, a dielectric layer is first deposited over the substrate 110, filling the trenches T1 with the dielectric material. In some embodiments, the dielectric layer may include silicon oxide, silicon nitride, silicon oxynitride, fluorine-doped silicate glass (FSG), a low-k dielectric, combinations thereof, and/or other suitable materials. The dielectric layer may comprise a fifth-type dielectric material (e.g., oxide-like low-k dielectrics) different from that of the first-type to fourth type dielectric materials. For example, an oxygen concentration in the fifth-type dielectric material is greater than that of the first-type to fourth type dielectric materials. In various examples, the dielectric layer may be deposited by a CVD process, a sub-atmospheric CVD (SACVD) process, a flowable CVD process, an ALD process, a physical vapor deposition (PVD) process, and/or other suitable processes. In some embodiments, after deposition of the dielectric layer, the integrated circuit structure may be annealed, for example, to improve the quality of the dielectric layer. In some embodiments, the dielectric layer (and subsequently formed structure 190) may include a multi-layer structure, for example, having one or more liner layers.

In some embodiments of forming the trench isolation structures 190, after deposition of the dielectric layer, the deposited dielectric material is thinned and planarized, for example by a chemical mechanical polishing (CMP) process. In some embodiments, the hard masks 150 functions as a CMP stop layer, so that the top surfaces of the trench isolation structures 190 may be substantially coplanar with the top surface of the hard masks 150 after the CMP process is completed.

Next, the trench isolation structures 190 are recessed in an etch back process, and a helmet layer 200 is formed over the recessed trench isolation structures 190. The etch back process may result in that the top surfaces of the trench isolation structures 190 are lower than the top surface of the hard masks 150. In some embodiments, the helmet layer 200 may include silicon oxide, silicon nitride, silicon oxynitride, silicon carbide, low-k dielectrics, the like, or the combination thereof. The helmet layer may comprise the third-type dielectric material as the inner spacer 170 does. Formation of the helmet layer 200 may include deposit a dielectric layer over the recessed trench isolation structures 190, the spacer 160, and the hard masks 150, followed by a CMP process. In some embodiments, the hard masks 150 functions as a CMP stop layer, so that the top surfaces of the helmet layer 200 may be substantially coplanar with the top surface of the hard masks 150 after the CMP process is completed.

Figure 7:
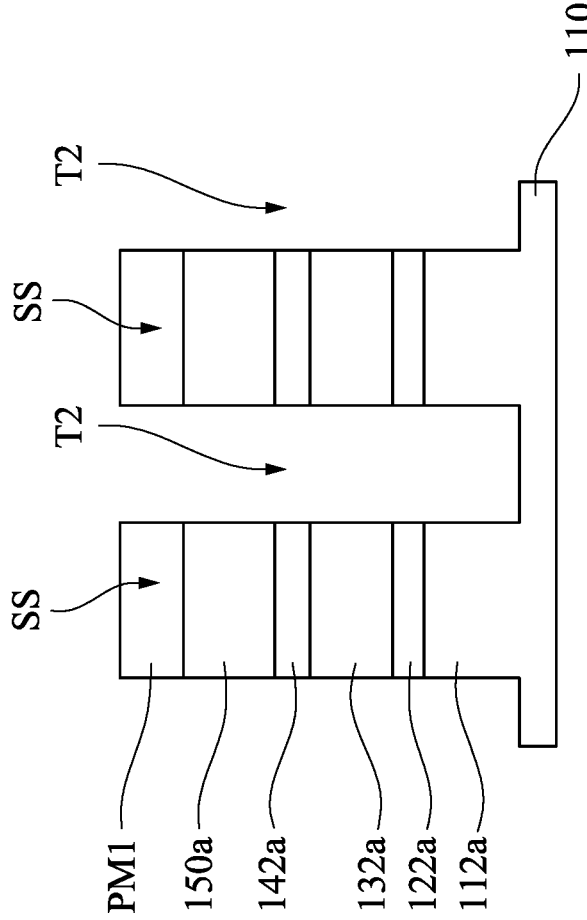
Figure 7:
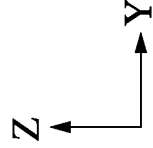

Reference is made to FIG. 7. One fin structure FS (referring to FIGS. 6A-6C) is cut into separate stack structures SS by a patterning process. Each of the stack structures SS include a substrate portion 112a patterned from the substrate portion 112 (referring to FIG. 6B), epitaxial layers 122a-142a respectively patterned from the epitaxial layers 122-142 (referring to FIG. 6B), and a hard mask 150a patterned from the hard mask 150 (referring to FIG. 6B).

The patterning process may include forming patterned masks PM1 over the hard mask 150 (referring to FIG. 6B), and then etching the hard mask 150, the epitaxial layers 122-142 and the substrate portion 112 (referring to FIG. 6B) by using the masks PM1 as etch mask. In some embodiments, the masks may include photoresist materials formed by suitable photolithography process.

After the etching the hard mask 150, the epitaxial layers 122-124 and the substrate portion 112 (referring to FIG. 6B), portions of the hard mask 150, the epitaxial layers 122-124 and the substrate portion 112 (referring to FIG. 6B) uncovered by the masks are removed. Remaining portions of the hard mask 150, the epitaxial layers 122-124 and the substrate portion 112 (referring to FIG. 6B) form the stack structures SS. Etching the hard mask 150, the epitaxial layers 122-124 and the substrate portion 112 (referring to FIG. 6B) results in trenches T2 between neighboring stack structures SS.

Figure 8:
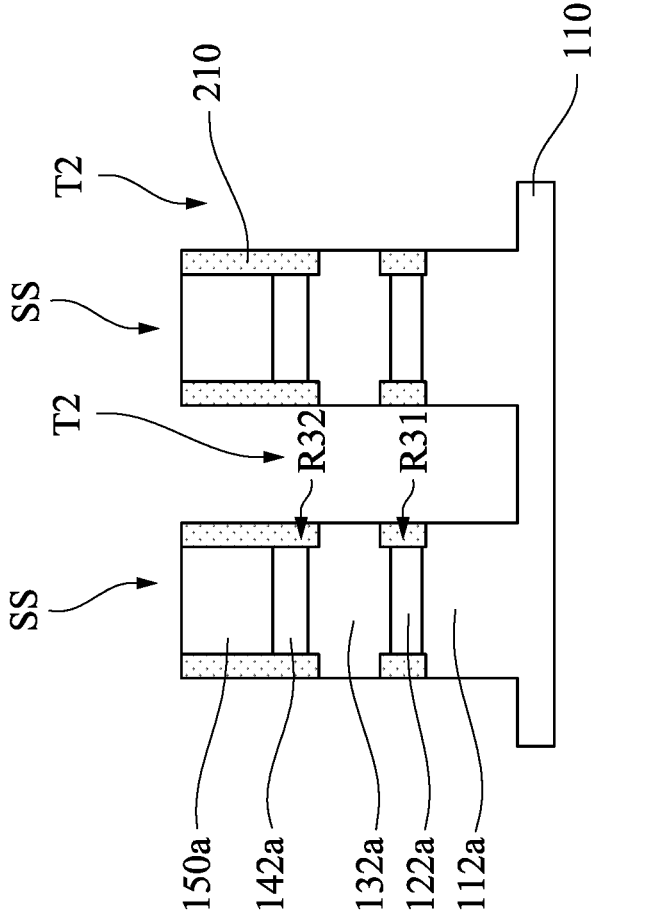
Figure 8:
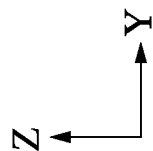

Reference is made to FIG. 8. Opposite ends of the sacrificial layers 122a and 142a exposed by the trench T2 are recessed, and spacers 210 are formed on the recessed opposite ends of the sacrificial layers 122a and 142a.

The sacrificial layers 122a and 142a may be laterally or horizontally recessed by using suitable etch techniques, resulting in lateral recesses R31 vertically between the Si channel layer 132a and the Si substrate portion 112a and recesses R31 over the Si channel layer 132a. This step may be performed by using a selective etching process. By way of example and not limitation, the sacrificial layers 122a and 142a are SiGe and the channel layers 132a and the substrate portion 112a are silicon allowing for the selective etching of the sacrificial layers 122a and 142a. In some embodiments, the selective wet etching includes an APM etch (e.g., ammonia hydroxide-hydrogen peroxide-water mixture) that etches SiGe at a faster etch rate than it etches Si. In some embodiments, the selective etching includes SiGe oxidation followed by a $SiGeO_x$ removal. For example, the oxidation may be provided by $O_3$ clean and then $SiGeO_x$ removed by an etchant such as $NH_4OH$ that selectively etches $SiGeO_x$ at a faster etch rate than it etches Si. Moreover, because oxidation rate of Si is much lower (sometimes 30 times lower) than oxidation rate of SiGe, the channel layers 132a remain substantially intact during laterally recessing the sacrificial layers 122a and 142a. As a result, the channel layers 132a laterally extend past opposite end surfaces of the sacrificial layers 122a and 142a along the direction X. The hard mask 150a, the spacer 160, and the helmet layer 200 (referring to FIG. 6A) may have a high etch resistance to the etch step than that of the epitaxial layers 122a-142a and the substrate portion 112a.

In some embodiments, after the formation of the trenches T2 in FIG. 7 and prior to recessing the opposite ends of the sacrificial layers 122a and 142a, with the patterned masks PM1 (referring to FIG. 7), ends of the hard masks 150a are cut by suitable etching process by using etchants show good etch selectivity between various types of the dielectric materials, such that portions of the hard masks 150a adjacent to the trenches T2 are removed. The patterned masks PM1 (referring to FIG. 7) can be removed by suitable ashing process after the end cut process. As a result, after the lateral recessing process to the sacrificial layers 122a and 142a, the recesses R32 on ends of the sacrificial layers 142a may extend to a level of the top end of the hard masks 150a.

After the sacrificial layers 122a and 142a have been laterally recessed, a spacer material layer is formed to fill the recesses R31 and R32 left by the lateral etching of the sacrificial layers 122a and 142a. The spacer material layer may be a suitable dielectric material, such as $SiO_2$, SiN, SiCN, SiOCN, low-k dielectrics, or the like and may be formed by a suitable deposition method, such as ALD, CVD, or the combination thereof. In some embodiments, the spacer material layer comprises the third-type dielectric material. After the deposition of the spacer material layer, an anisotropic etching process may be performed to trim the deposited spacer material, such that only portions of the deposited spacer material that fill the recesses R31 and R32 left by the lateral etching of the sacrificial layers 122a and 142a are left. After the trimming process, the remaining portions of the deposited spacer material are denoted as spacers 210. In some embodiments, sidewalls of the spacers 210 may be vertically aligned with sidewalls of the channel layers 132a.

In some embodiments, the etch technique for forming the recesses R31 and R32 may consume top and bottom portions of the channel layer 132a and top portions of the substate portion 112a adjacent to the recesses R31, such that a height of the recesses R31 and R32 is greater than the corresponding sacrificial layers 122a and 142a. As a result, a height of the spacers 210 can be greater than heights of the corresponding sacrificial layers 122a and 142a. In some alternative embodiments, the top and bottom portions of the channel layer 132a and top portions of the substate portion 112a may not substantially consumed, and a height of the spacers 210 in the recess R31 can be equal to heights of the corresponding sacrificial layers 122a.

Figure 9:
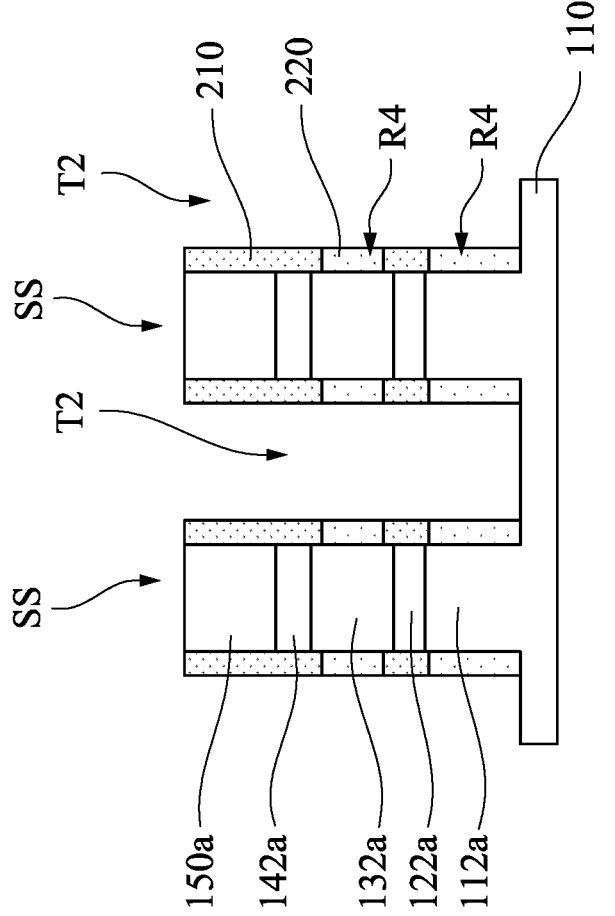
Figure 9:
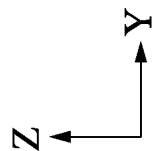

Reference is made to FIG. 9. Opposite ends of the channel layers 132a and the substrate portion 112a exposed by the trench T2 may be laterally or horizontally recessed by using suitable etch techniques, resulting in lateral recesses R4. The etch process can be a wet etch, dry etch, or the combination thereof. The etch process may etch the channel layers 132a and the substate portion 112a at a faster rate than it etches the spacers 210. Thus, recesses R4 can be formed between the spacers 210 and between the spacer 210 and the substrate 110.

Dummy spacers 220 are formed on the recessed opposite ends of the channel layers 132a and the substrate portion 112a. After the channel layers 132a and the substrate portion 112a have been laterally recessed, a dummy spacer material layer is formed to fill the recesses R4 left by the lateral etching of the channel layers 132a. The dummy spacer material layer may be a suitable dielectric material, such as $SiO_2$, SiN, SiCN, or SiOCN, and may be formed by a suitable deposition method, such as ALD, CVD, or the combination thereof. In some embodiments, the dummy spacer material layer comprises a fourth-type dielectric material. After the deposition of the dummy spacer material layer, an anisotropic etching process may be performed to trim the deposited dummy spacer material, such that only portions of the deposited dummy spacer material that fill the recesses R4 left by the lateral etching of the channel layers 130a and the substrate portion 112a are left. After the trimming process, the remaining portions of the deposited dummy spacer material are denoted as dummy spacers 220. The dummy spacers 220 will be replaced with metal gates in subsequent processing. In some embodiments, sidewalls of the dummy spacers 220 may be vertically aligned with sidewalls of the spacers 210.

In some embodiments, the lateral recessing process is controlled such that opposite ends of the substrate portion 112a are laterally etched less than the opposite ends of the channel layers 132a are. As a result, the dummy spacers 220 formed on the opposite ends of the channel layers 132a is thicker than the dummy spacers 220 formed on the opposite ends of the substrate portion 112a. In some alternative embodiments, the lateral recessing process is controlled such that opposite ends of the substrate portion 112a are not substantially laterally etched, and the opposite ends of channel layers 132a are laterally etched. As a result, the dummy spacers 220 are formed on the opposite ends of the channel layers 132a, not formed on the opposite ends of the substrate portion 112a.

Figure 10A:
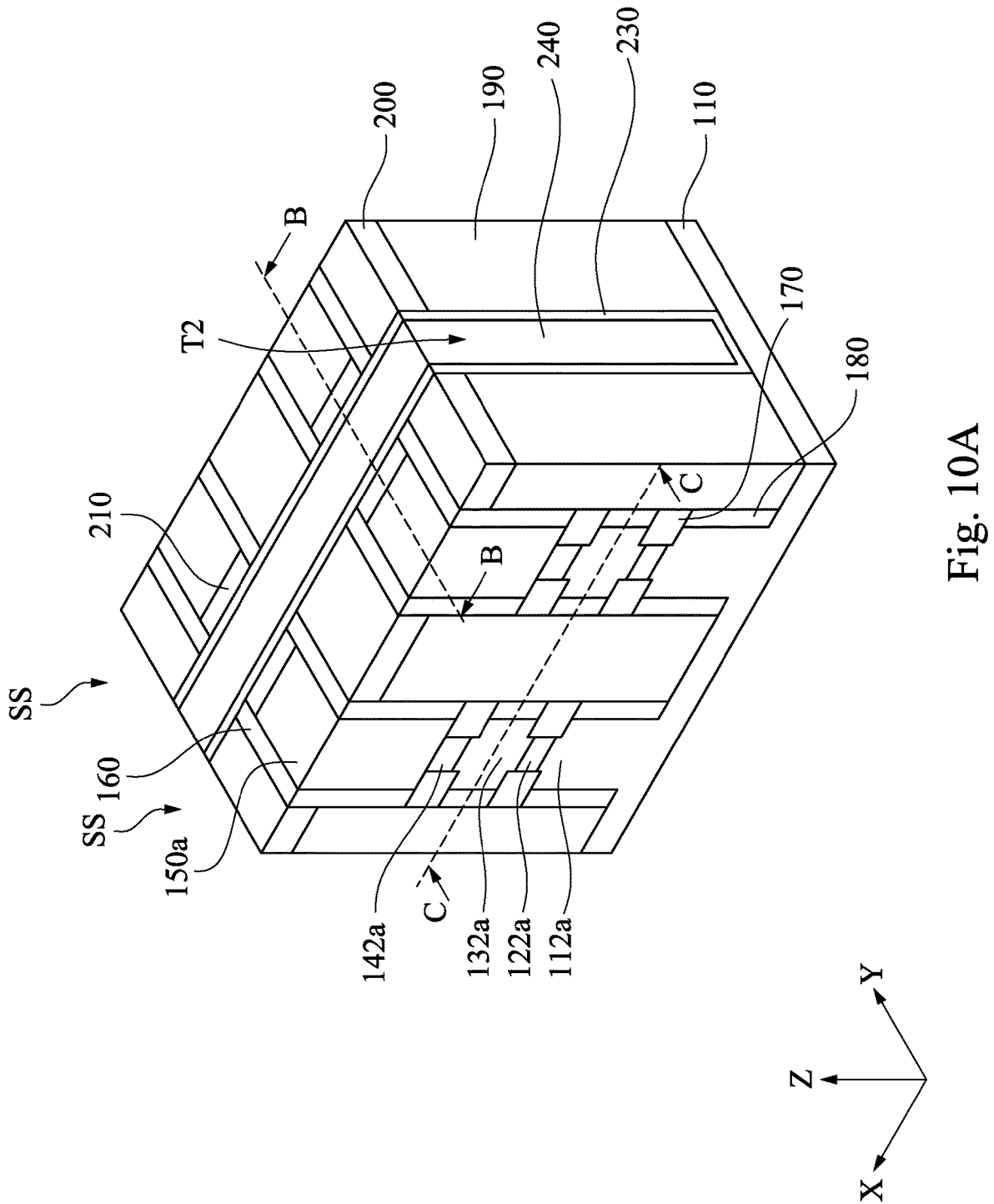
Figure 10B:
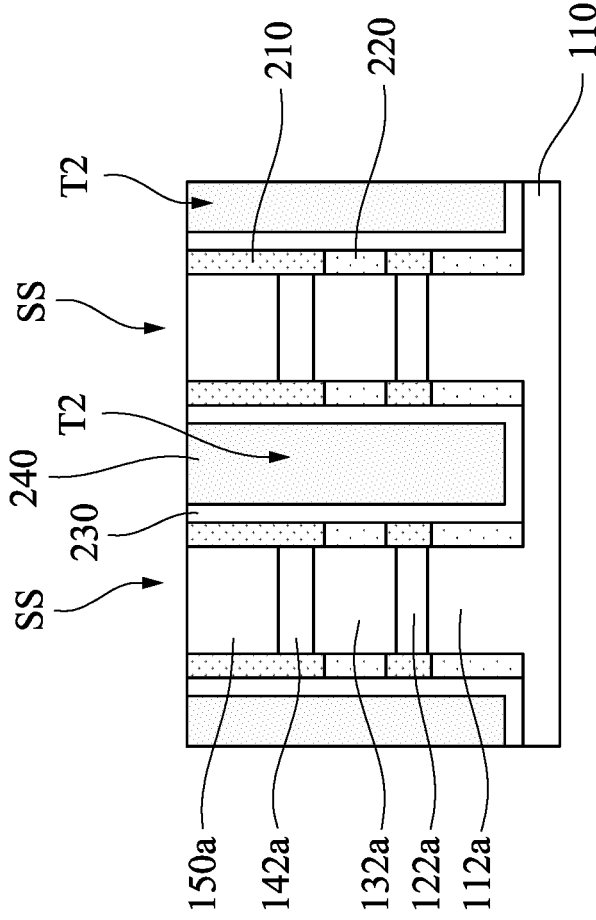
Figure 10B:
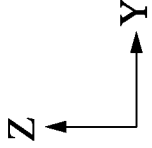
Figure 10C:
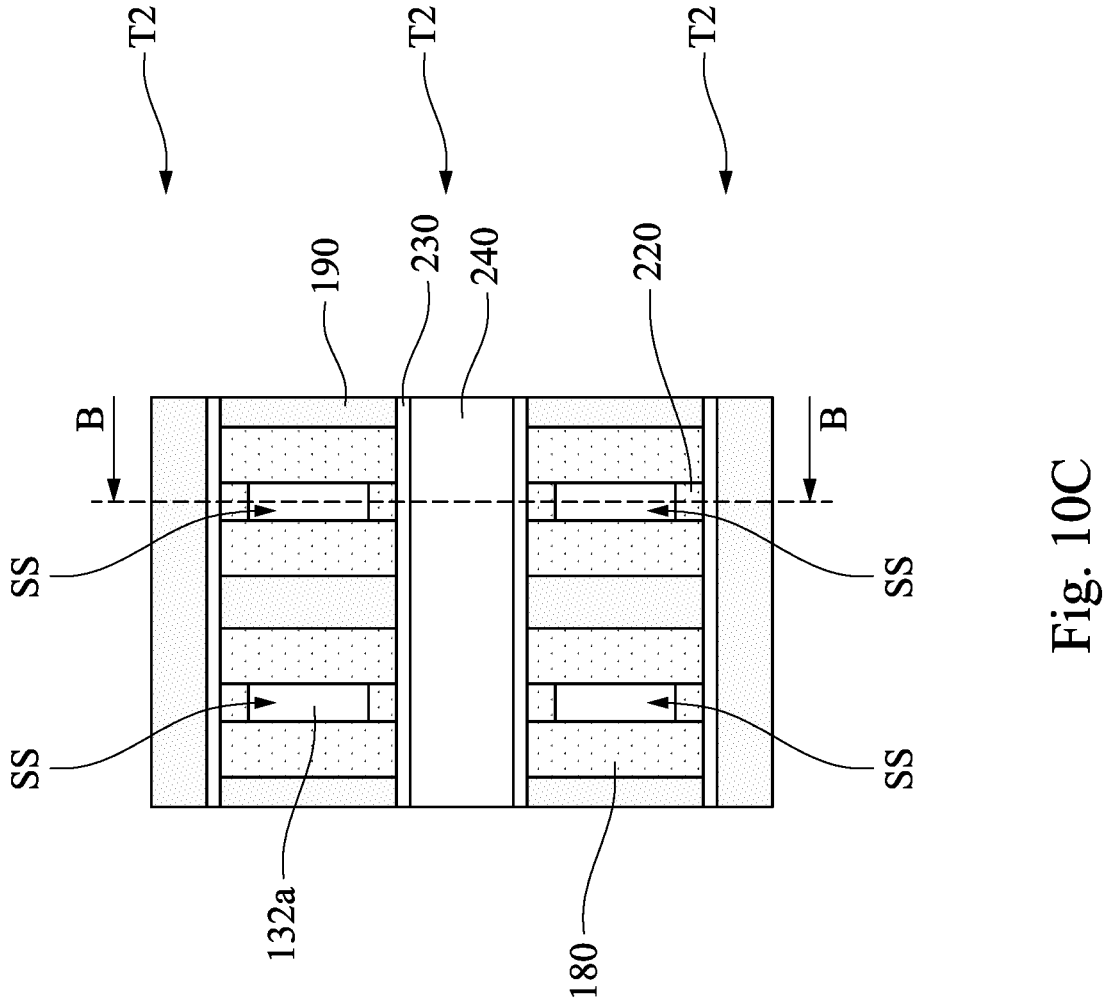

Reference is made to FIGS. 10A-10C. Trench isolation structures 240 are formed in the trenches T2 between the stack structures SS. By way of example and not limitation, a dielectric layer is first deposited over the substrate 110, filling the trenches T2 with the dielectric material. In some embodiments, the dielectric layer may include silicon oxide, silicon nitride, silicon oxynitride, fluorine-doped silicate glass (FSG), a low-k dielectric, combinations thereof, and/or other suitable materials. The dielectric layer may comprise a fifth-type dielectric material different from that of the first-type to fourth type dielectric materials. In various examples, the dielectric layer may be deposited by a CVD process, a sub-atmospheric CVD (SACVD) process, a flowable CVD process, an ALD process, a physical vapor deposition (PVD) process, and/or other suitable processes. In some embodiments, after deposition of the dielectric layer, the integrated circuit structure may be annealed, for example, to improve the quality of the dielectric layer. In some embodiments, prior to depositing the dielectric layer that subsequently forms the structure 240, one or more dielectric liner layers 230 may be conformally deposited into the trench T2. The dielectric liner layer 230 may comprises the first-type dielectric material.

In some embodiments of forming the trench isolation structures 240, after deposition of the dielectric layer, the deposited dielectric material is thinned and planarized, for example by a chemical mechanical polishing (CMP) process. In some embodiments, the hard masks 150a and/or the helmet layer 200 functions as a CMP stop layer, so that the top surfaces of the trench isolation structure 240 may be substantially coplanar with the top surface of the hard masks 150a and/or the helmet layer 200 after the CMP process is completed. Referring to the plan top view of FIG. 10C, each of the channel layers 132a is surrounded by two dummy spacers 180 and two dummy spacers 220 at its four sides in XY plane.

Figure 11A:
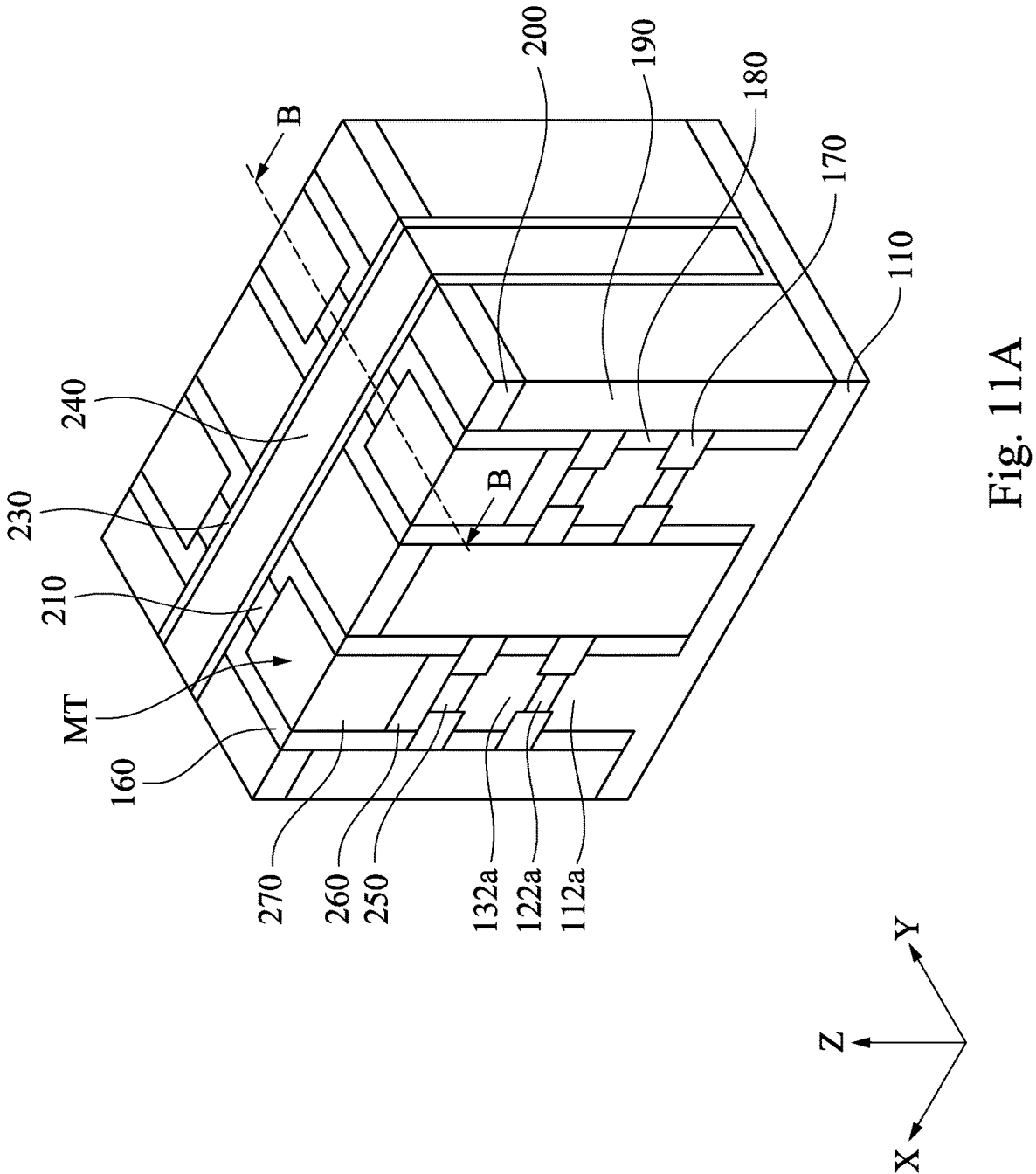

Reference is made to FIGS. 11A and 11B. The hard masks 150a and the sacrificial layers 142a (referring to FIGS. 10A-10C) are replaced by an epitaxial layer 250, a source/ drain epitaxial structure 260, and a hard mask 270. For example, the hard masks 150a and the sacrificial layers 142a (referring to FIGS. 10A-10C) are removed by suitable etching processes, leaving spaces (e.g., trenches MT) between the spacers 160 and the upper one of the inner spacers 170. The removals of the hard masks 150a and the sacrificial layers 142a is performed such that tops of the channel layers 132a are exposed. Then, the epitaxial layer 250, the source/drain epitaxial structure 260, and the hard mask 270 are formed into the spaces (e.g., trenches MT) between the spacers 160 and the upper one of the inner spacers 170 in a sequence.

By way of example, epitaxial growth of the epitaxial layers 250 may be performed by a molecular beam epitaxy (MBE) process, a metalorganic chemical vapor deposition (MOCVD) process, and/or other suitable epitaxial growth processes. In some embodiments, the epitaxially grown layers such as, the epitaxial layers 250 include the same material as the channel layer 132a, such as an epitaxially grown silicon (Si) layer. Alternatively, in some embodiments, either of the epitaxial layers 250 and 140 may include other materials such as germanium, a compound semiconductor such as silicon carbide, gallium arsenide, gallium phosphide, indium phosphide, indium arsenide, and/or indium antimonide, an alloy semiconductor such as SiGe, GaAsP, AlInAs, AlGaAs, InGaAs, GaInP, and/or GaInAsP, or combinations thereof. In some other embodiments, the epitaxial layers 250 are substantially dopant-free (i.e., having an extrinsic dopant concentration from about 0 cm$^{-3}$ to about $1 \times 10^{18}$ cm$^{-3}$), where for example, no intentional doping is performed during the epitaxial growth process. In some embodiments, the epitaxial layers 250 are lightly doped (i.e., having a dopant concentration lower than the source/drain epitaxial structure 260). The epitaxial layers 250 may be referred to as lightly doped drain (LDD) region in some embodiments.

Source/drain epitaxial structures 260 are formed into the spaces between the spacers 160. The source/drain epitaxial structures 260 may be formed by performing an epitaxial growth process that provides an epitaxial material on the epitaxial layers 250. Suitable epitaxial processes include CVD deposition techniques (e.g., vapor-phase epitaxy (VPE) and/or ultra-high vacuum CVD (UHV-CVD)), molecular beam epitaxy, and/or other suitable processes. The epitaxial growth process may use gaseous and/or liquid precursors, which interact with the composition of semiconductor materials of the epitaxial layers 250. In some embodiments, the source/drain epitaxial structures 260 may include Ge, Si, GaAs, AlGaAs, SiGe, GaAsP, SiP, or other suitable material. The source/drain epitaxial structures 260 may be in-situ doped during the epitaxial process by introducing doping species including: p-type dopants, such as boron; n-type dopants, such as phosphorus or arsenic; and/or other suitable dopants including combinations thereof. If the source/drain epitaxial structures 260 are not in-situ doped, an implantation process (i.e., a junction implant process) is performed to dope the source/drain epitaxial structures 260. In some exemplary embodiments, the source/drain epitaxial structures 260 in an NVFET device include SiP, while those in a PFET device include GeSnB and/or SiGeSnB.

The hard masks 270 is formed to fill the spaces between the spacers 160. The hard masks 270 may include a suitable dielectric material, such as silicon nitride, silicon oxynitride, silicon oxide, silicon carbide, the like, or the combination thereof. In some embodiments, the hard masks 270 comprises the first-type dielectric material. Formation of the hard masks 270 may include depositing a hard mask layer, followed by CMP process. Remaining portions of the hard mask layer form the hard masks 270.

Figure 12A:
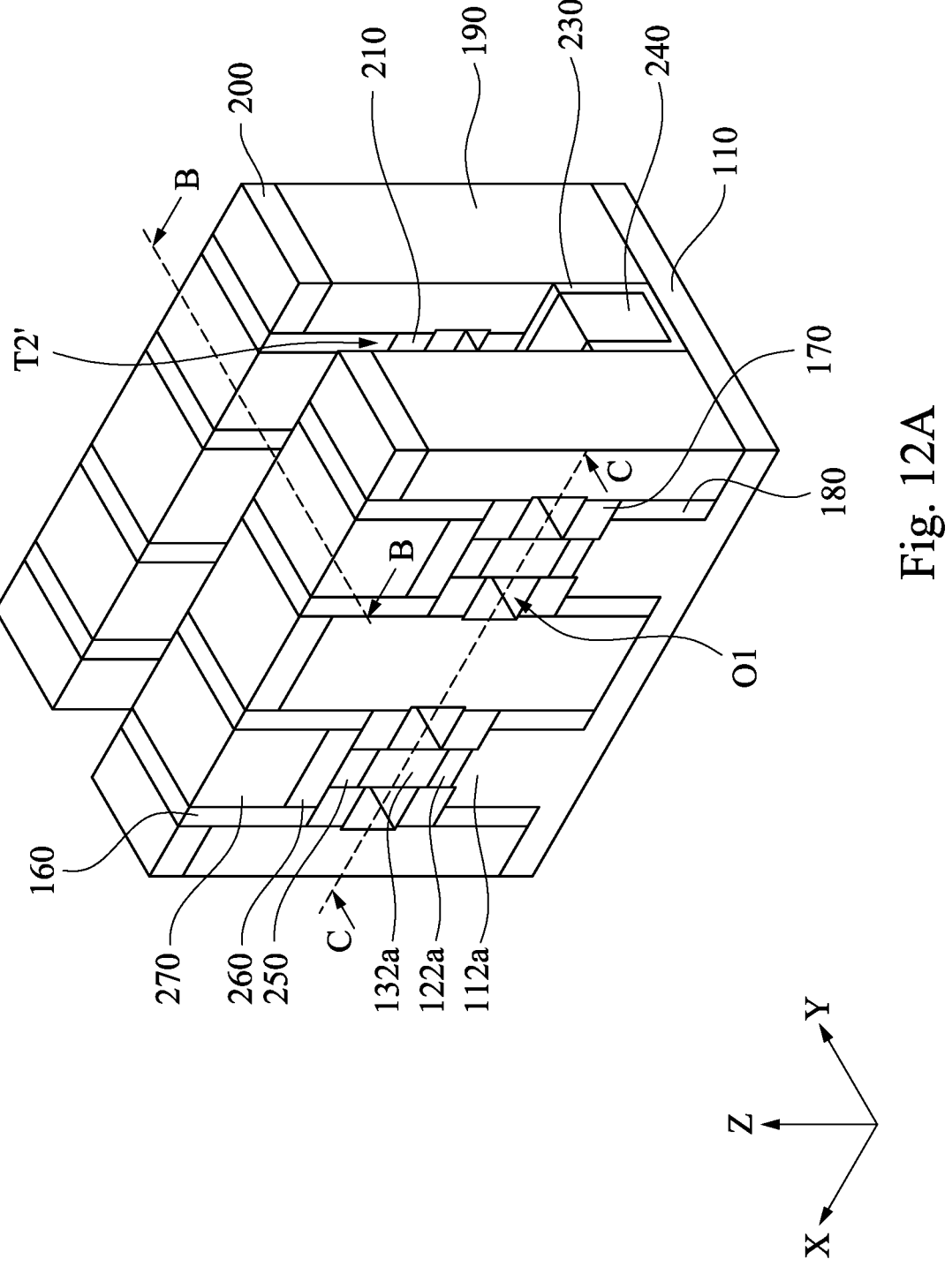

FIGS. 12A-13C illustrates the formation of the gate structures GS in a self-aligned manner. Reference is made to FIGS. 12A-12C. A first etching process is performed to recess top surfaces of the trench isolation structures 240, leaving a trench T2′ between the stack structures SS. A second etching process is performed to remove a top portion of the dielectric liner layer 230 above the recessed top surfaces of the trench isolation structures 240, such that the dummy spacers 180 and 220 (referring to FIGS. 10A-11B) can be exposed by the trench T2′. A third etching process is performed to remove the dummy spacers 180 and 220 (referring to FIGS. 10A-11B), leaving gate openings O1 around each of the channel layers 132a. In some embodiments, the first to third etching process are performed without additional masks, and can be referred to as maskless etching processes.

The first etching process may result in that the top surfaces of the trench isolation structures 240 are lower than the top surface of the spacers 170 and 210. The first etching process may be a dry etch back process. The dry etch back process can us suitable gas or plasma that etches the fifth-type dielectric material (e.g., the trench isolation structures 240) at a faster etch rate than it etches the first-type dielectric material (e.g., the hard masks 270 and the dielectric liner layer 230), the second-type dielectric material (e.g., the spacers 160), and the third-type dielectric material (e.g., the helmet layer 200 and the spacers 170 and 210). As a result, the first-type dielectric material (e.g., the hard masks 270 and the dielectric liner layer 230), the second-type dielectric material (e.g., the spacers 160), and the third-type dielectric material (e.g., the helmet layer 200 and the spacers 170 and 210) can not be substantially etched by the dry etch back process.

In some embodiments, the second etching process is a wet etch process. The second etching process may use suitable liquid for removing the top portion of the dielectric liner layer 230 above the recessed top surfaces of the trench isolation structures 240. The second etching process may also be referred to as a cleaning process or a liner removal process.

The third etching process may use suitable etchant that show etch selectivity for the fourth-type dielectric material (e.g., materials of the dummy spacers 180 and 220 (referring to FIGS. 10A-111B)) versus the first-type dielectric material (e.g., the hard masks 270 and the dielectric liner layer 230), the second-type dielectric material (e.g., the spacers 160), the third-type dielectric material (e.g., materials of the spacers 170 and 210), and the fifth-type dielectric material (e.g., the trench isolation structures 240 and 190). In some embodiments, the third etching process can be a wet etch process using liquid etchant showing the etch selectivity. The liquid etchant of the third etching process is different from the liquid of the second etching process. That is, the third etching process etches the fourth-type dielectric material (e.g., materials of the dummy spacers 180 and 220 (referring to FIGS. 10A-11B)) at a faster rate than it etches the first-type dielectric material (e.g., the hard masks 270 and the dielectric liner layer 230), the second-type dielectric material (e.g., the spacers 160), the third-type dielectric material (e.g., materials of the spacers 170 and 210), and the fifth-type dielectric material (e.g., the trench isolation structures 240 and 190). The third etching process may not substantially etch the channel layers 132a, the isolation structures 240 and 190, the spacers 170 and 210, the spacers 160, the hard masks 270, and the dielectric liner layer 230.

Figure 12C:
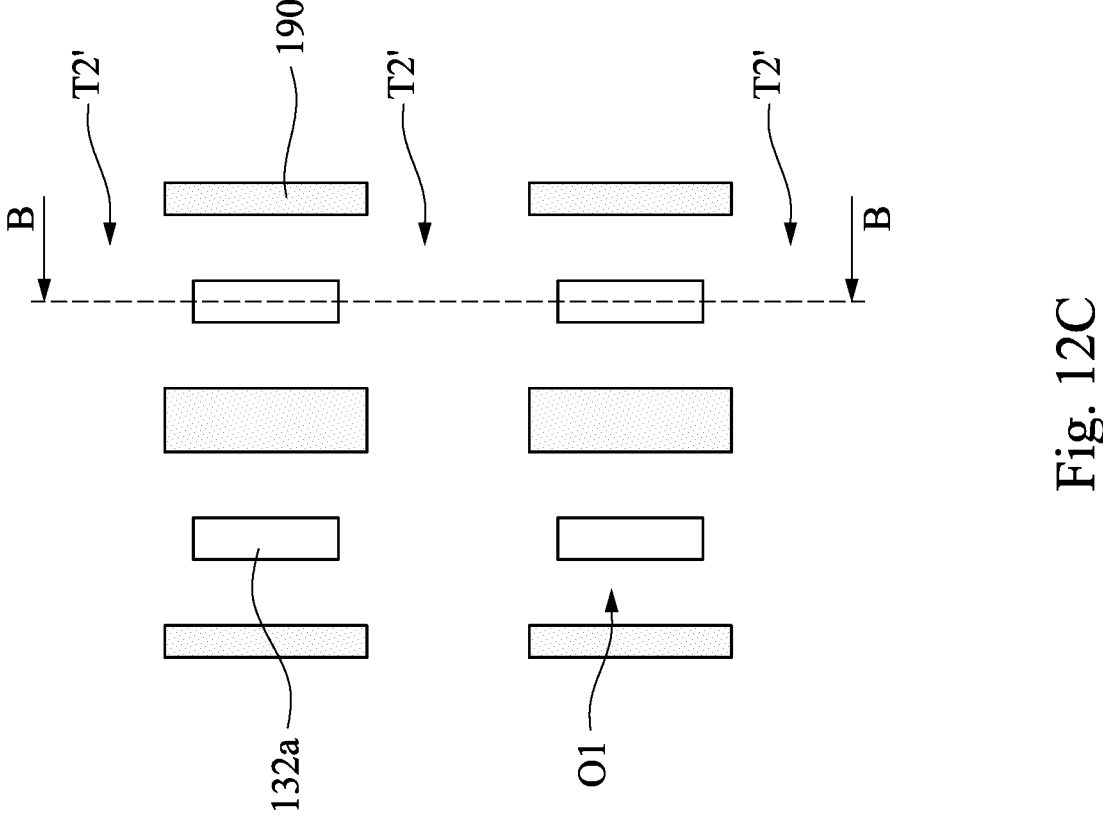

Referring to FIG. 12C, after the third etching process, the four sides of the channel layer 132a is exposed by the gate openings O1 in the XY plane. Each of the gate openings O1 may have a shape of ring in the XY plane.

Figure 13A:
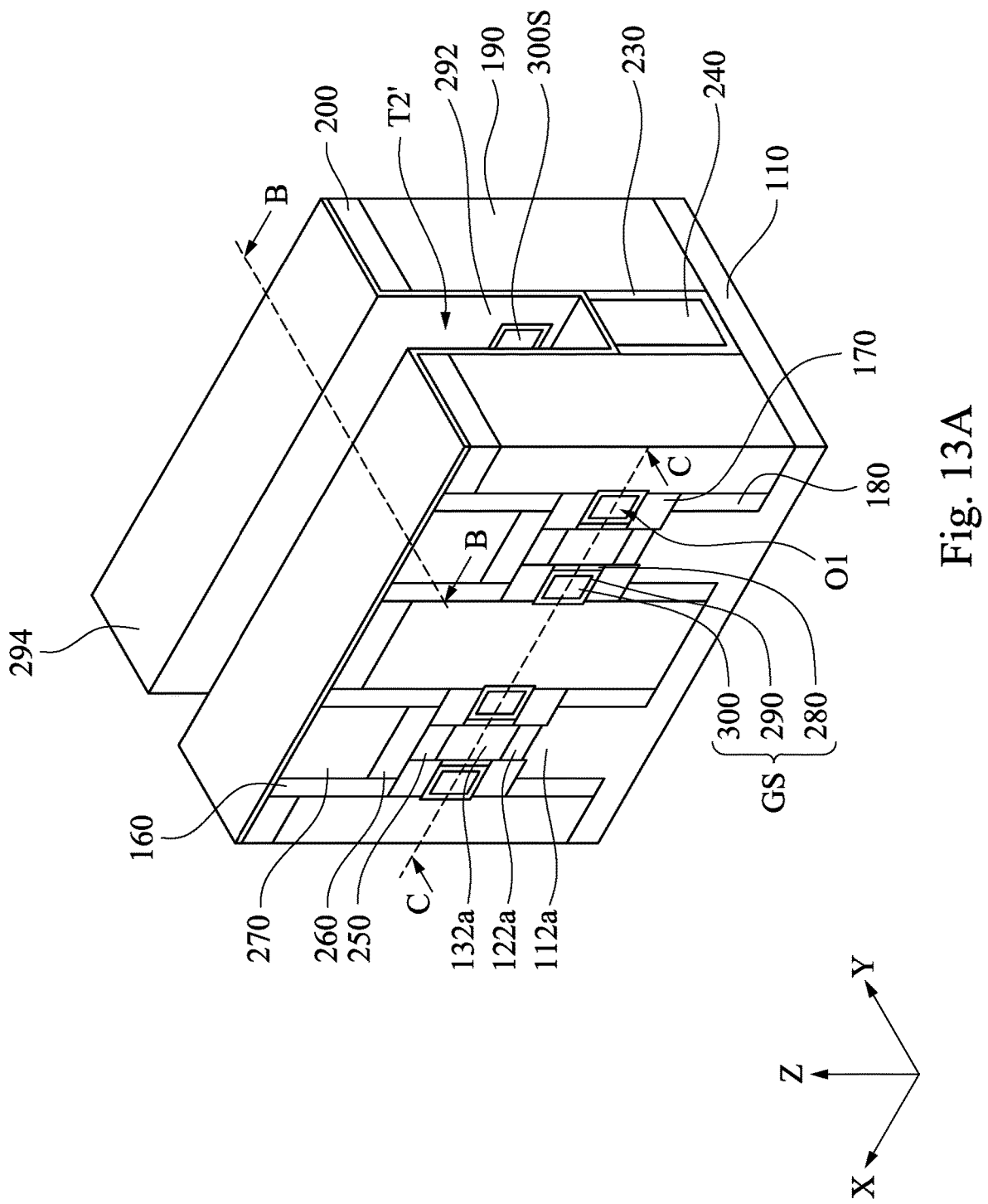
Figure 13B:
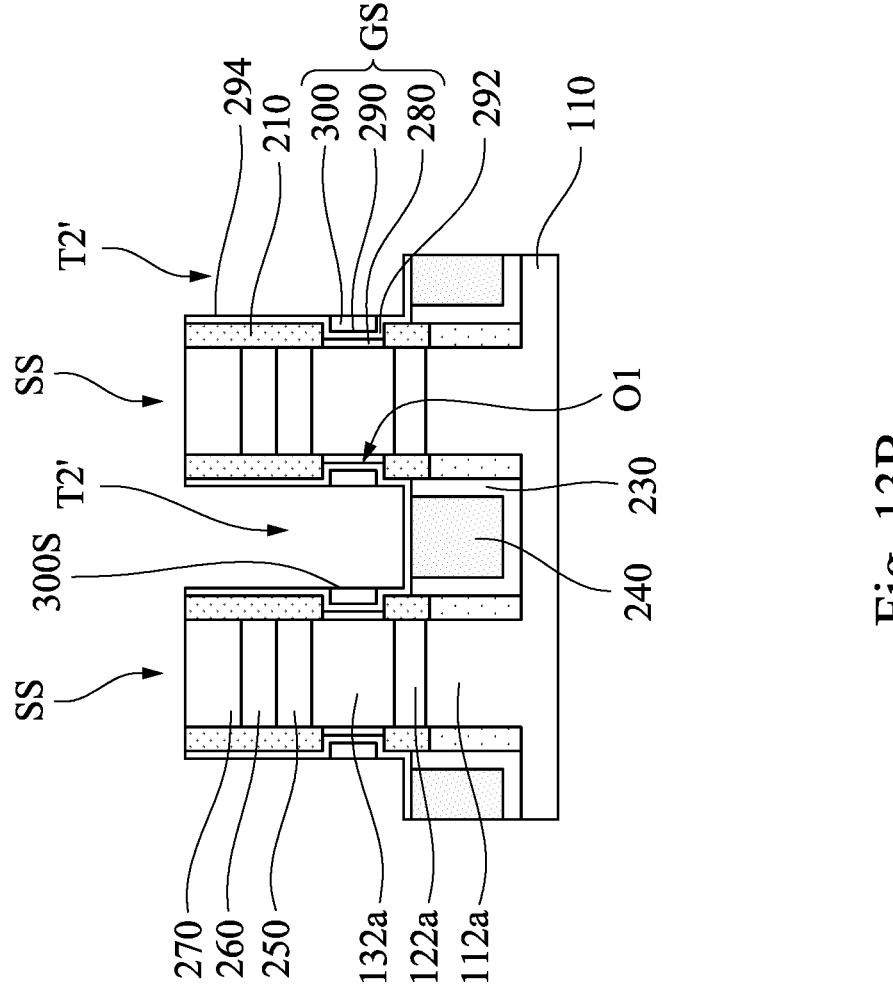
Figure 13C:
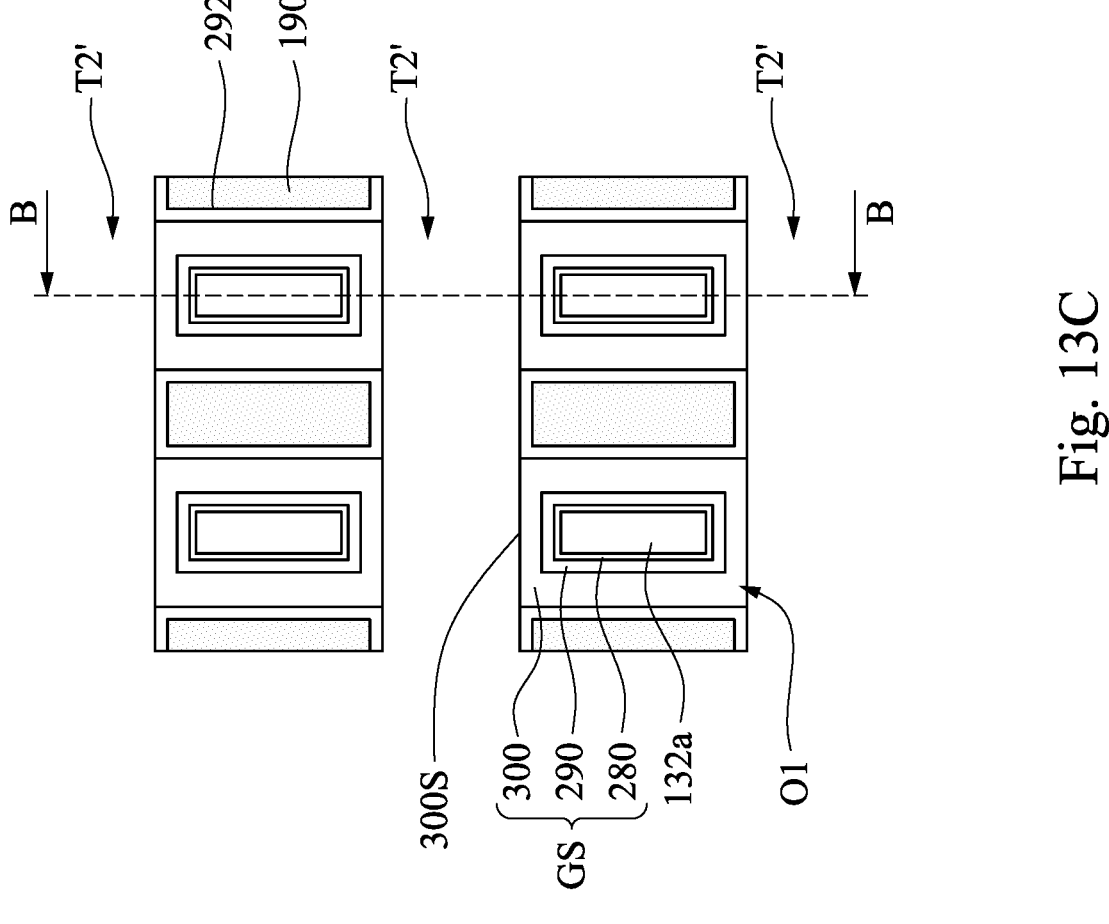

Reference is made to FIGS. 13A-13C. Gate structures GS are respectively formed in the gate openings O1 to surround each of the channel layer 132a exposed in the gate openings O1. The gate structures GS may be gates of VFETs. The gate structure GS may be a high-k/metal gate stack, however other compositions are possible. The gate structure GS includes an interfacial layer 280 formed around the channel layer 132a, a high-k dielectric layer 290 formed around the interfacial layer 280, and a gate metal 300 formed around the high-k dielectric layer 290 and filling a remainder of gate openings O1. Formation of the high-k/metal gate structures GS may include one or more deposition processes to form various gate dielectric materials and gate metal materials, followed by an etching or cleaning processes to remove excessive gate metal materials. Through the steps, the high-k dielectric layer 290 have a first portion 292 extending along sidewalls of the gate openings O1 and a second portion 294 extending along sidewalls of the trench T2′. The gate metals 300 is surrounded by the first portion 292 of the high-k dielectric layer 290.

In some embodiments, the interfacial layer 280 is silicon oxide formed on exposed surfaces of semiconductor materials in the gate openings O1 by using, for example, thermal oxidation, chemical oxidation, wet oxidation or the like. As a result, surface portions of the channel layer 132a exposed in the gate openings O1 are oxidized into silicon oxide to form interfacial layer 280.

In some embodiments, the high-k dielectric layer 290 includes dielectric materials such as hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), lanthanum oxide (LaO), zirconium oxide (ZrO), titanium oxide (TiO), tantalum oxide ($Ta_2O_5$), yttrium oxide ($Y_2O_3$), strontium titanium oxide ($SrTiO_3$, STO), barium titanium oxide ($BaTiO_3$, BTO), barium zirconium oxide (BaZrO), hafnium lanthanum oxide (HfLaO), lanthanum silicon oxide (LaSiO), aluminum silicon oxide (AlSiO), aluminum oxide ($Al_2O_3$), the like, or combinations thereof. The high-k dielectric layer 290 can be deposited by suitable ALD process.

In some embodiments, the gate metal 300 includes one or more metal layers. For example, the gate metal 300 may include one or more work function metal layers stacked one over another and a fill metal filling up a remainder of gate openings O1. The one or more work function metal layers in the gate metal 300 provide a suitable work function for the high-k/metal gate structures GS. For an n-type GAA FET, the gate metal 300 may include one or more n-type work function metal (N-metal) layers. The n-type work function metal may exemplarily include, but are not limited to, titanium aluminide (TiAl), titanium aluminium nitride (TiAlN), carbo-nitride tantalum (TaCN), hafnium (Hf), zirconium (Zr), titanium (Ti), tantalum (Ta), aluminum (Al), metal carbides (e.g., hafnium carbide (HfC), zirconium carbide (ZrC), titanium carbide (TiC), aluminum carbide (AlC)), aluminides, and/or other suitable materials. On the other hand, for a p-type GAA FET, the gate metal 300 may include one or more p-type work function metal (P-metal) layers. The p-type work function metal may exemplarily include, but are not limited to, titanium nitride (TiN), tungsten nitride (WN), tungsten (W), ruthenium (Ru), palladium (Pd), platinum (Pt), cobalt (Co), nickel (Ni), conductive metal oxides, and/or other suitable materials. In some embodiments, the fill metal in the gate metal 300 may exemplarily include, but are not limited to, tungsten, aluminum, copper, nickel, cobalt, titanium, tantalum, titanium nitride, tantalum nitride, nickel silicide, cobalt silicide, TaC, TaSiN, TaCN, TiAl, TiAlN, or other suitable materials. The gate metal 300 can be deposited by suitable ALD process.

In some embodiments, the deposition of the gate metal 300 may result in metal residues in the trench T2', over the isolation structure 240, and external to the openings O1. A wet etch or clean process can be performed to remove the metal residues from the high-k dielectric layer 290. As a result, the gate metal 300 has a sidewall 300S exposed by the trench T2' and aligned with sidewalls of the second portion 294 of the high-k dielectric layer 290.

Figure 14A:
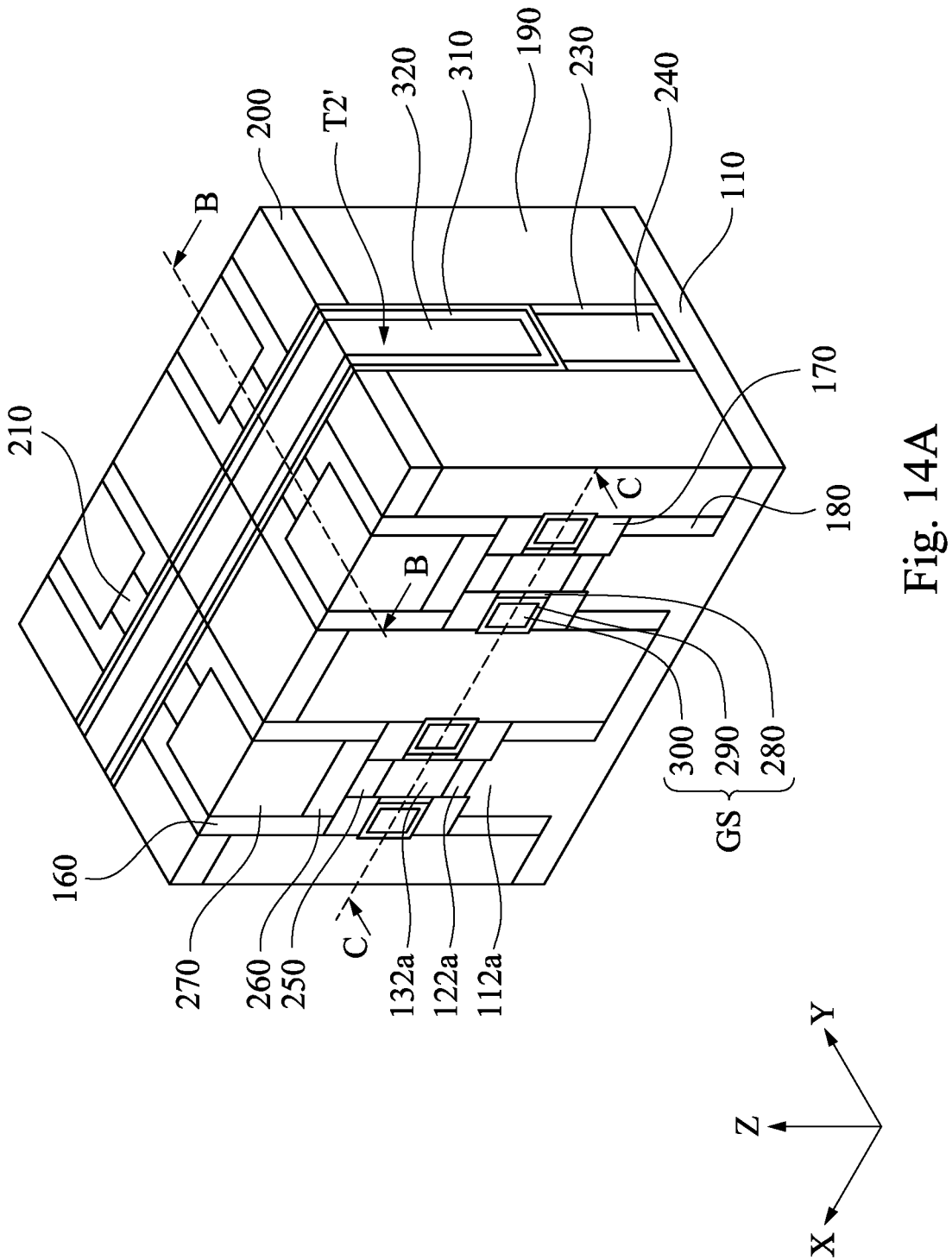
Figure 14B:
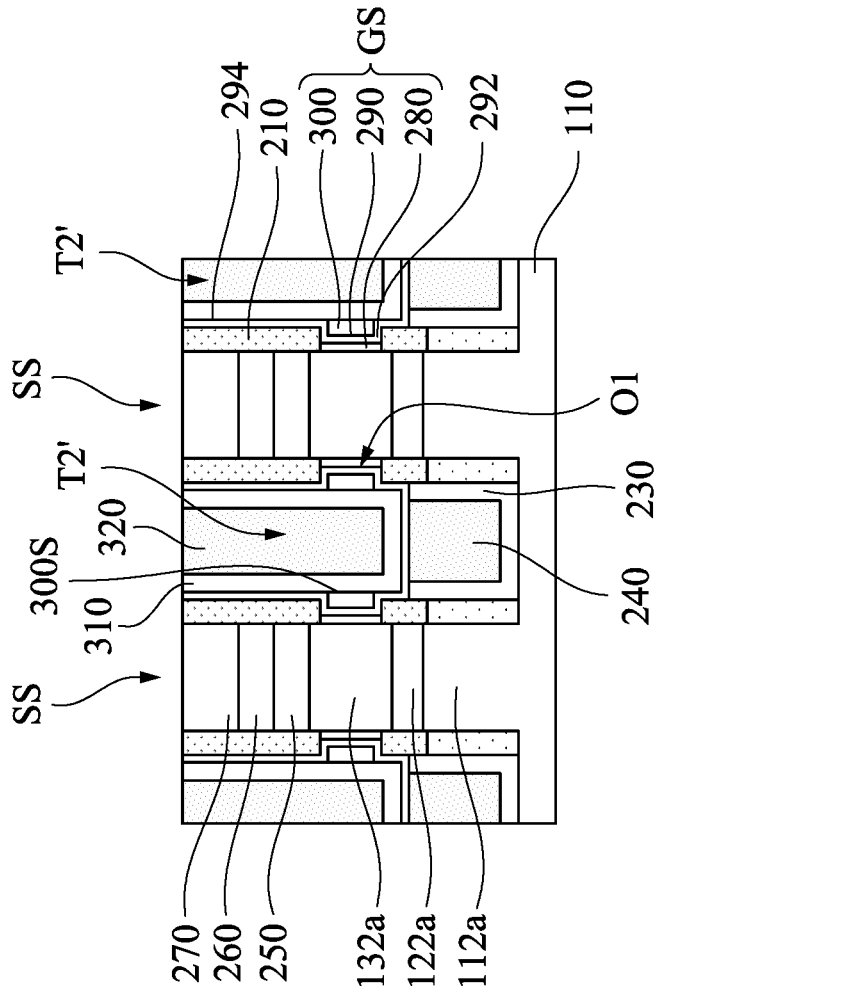
Figure 14B:
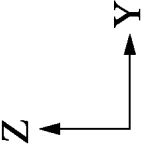
Figure 14C:
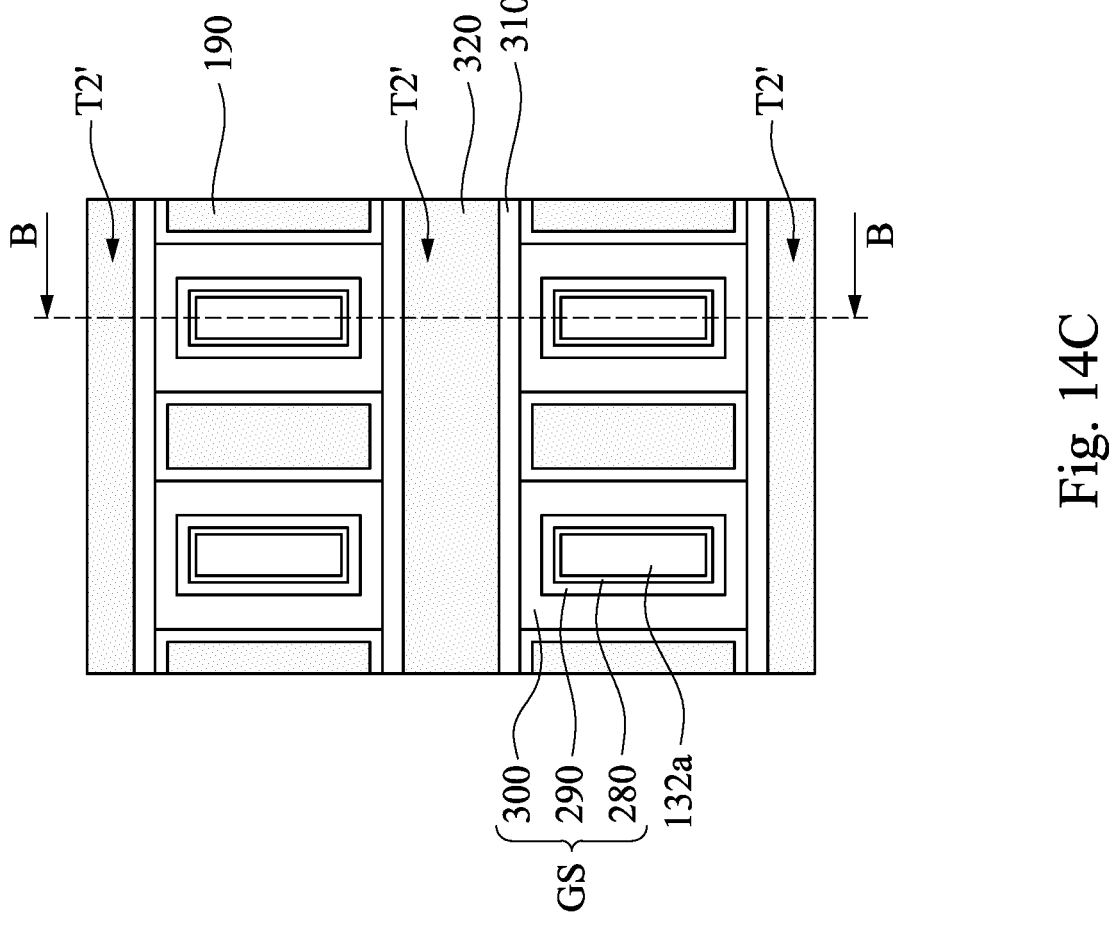

Reference is made to FIGS. 14A-14C. Trench isolation structures 320 are formed in the trenches T2' between the stack structures SS. By way of example and not limitation, a dielectric layer is first deposited over the substrate 110, filling the trenches T2' with the dielectric material. In some embodiments, the dielectric layer may include silicon oxide, silicon nitride, silicon oxynitride, fluorine-doped silicate glass (FSG), a low-k dielectric, combinations thereof, and/or other suitable materials. The dielectric layer may comprise a fifth-type dielectric material different from that of the first-type to fourth type dielectric materials. In various examples, the dielectric layer may be deposited by a CVD process, a sub-atmospheric CVD (SACVD) process, a flowable CVD process, an ALD process, a physical vapor deposition (PVD) process, and/or other suitable processes. In some embodiments, after deposition of the dielectric layer, the integrated circuit structure may be annealed, for example, to improve the quality of the dielectric layer. In some embodiments, prior to depositing the dielectric layer that subsequently forms the structure 320, one or more dielectric liner layers 310 may be conformally deposited into the trench T2'. The dielectric liner layer 310 may comprises the first-type dielectric material.

In some embodiments of forming the trench isolation structures 320, after deposition of the dielectric layer, the deposited dielectric material is thinned and planarized, for example by a chemical mechanical polishing (CMP) process. In some embodiments, the hard masks 270 and/or the helmet layer 200 functions as a CMP stop layer, so that the top surfaces of the trench isolation structure 320 may be substantially coplanar with the top surface of the hard masks 270 and/or the helmet layer 200 the after the CMP process is completed.

Figure 15A:
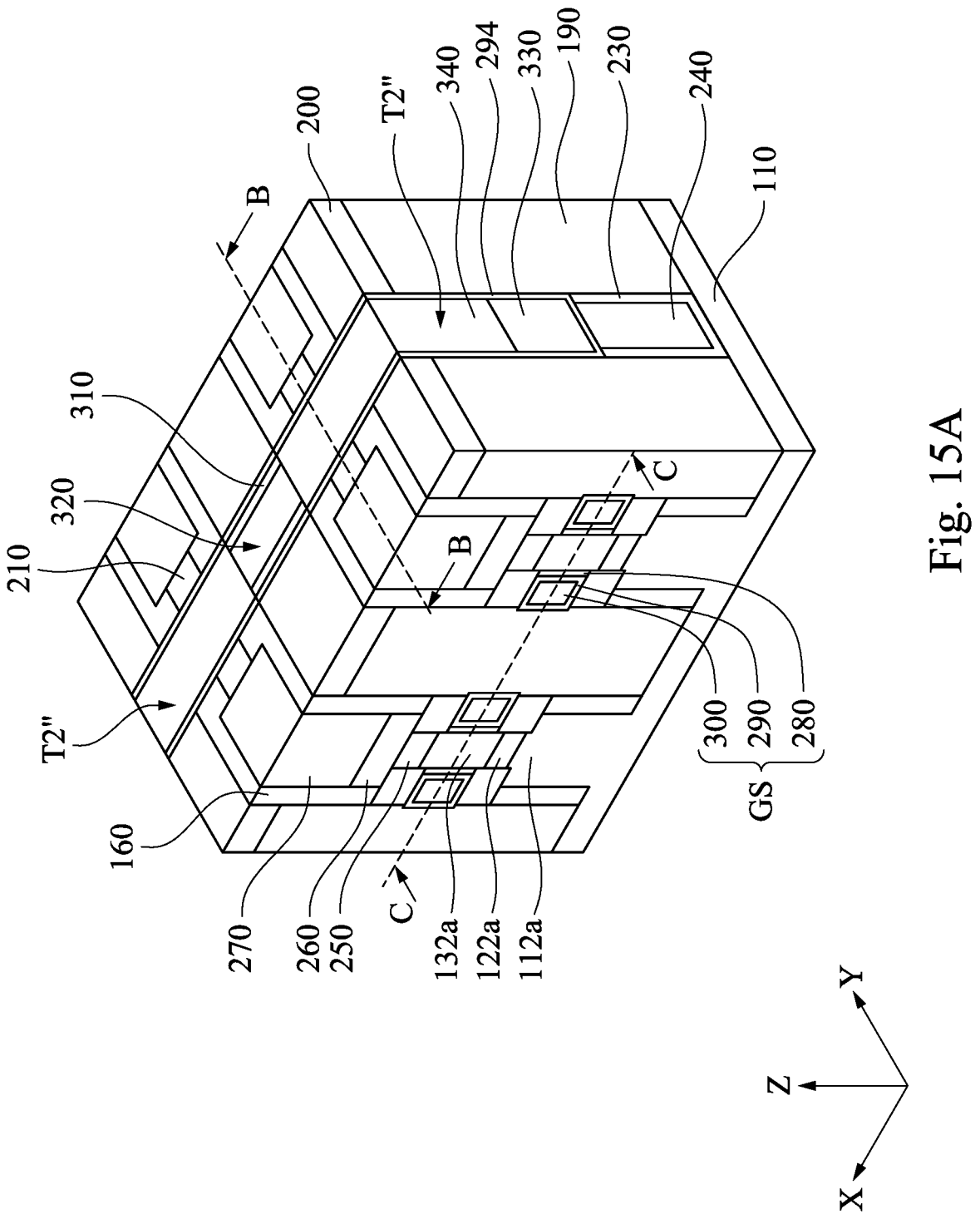
Figure 15B:
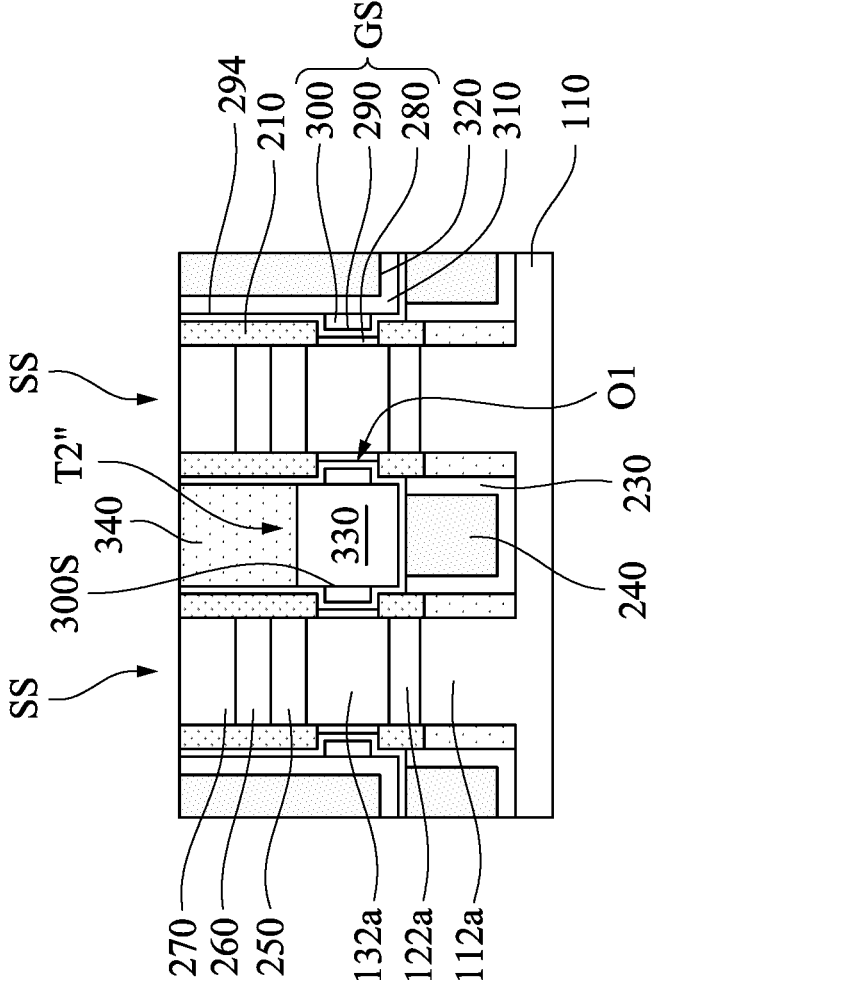
Figure 15B:
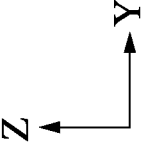
Figure 15C:
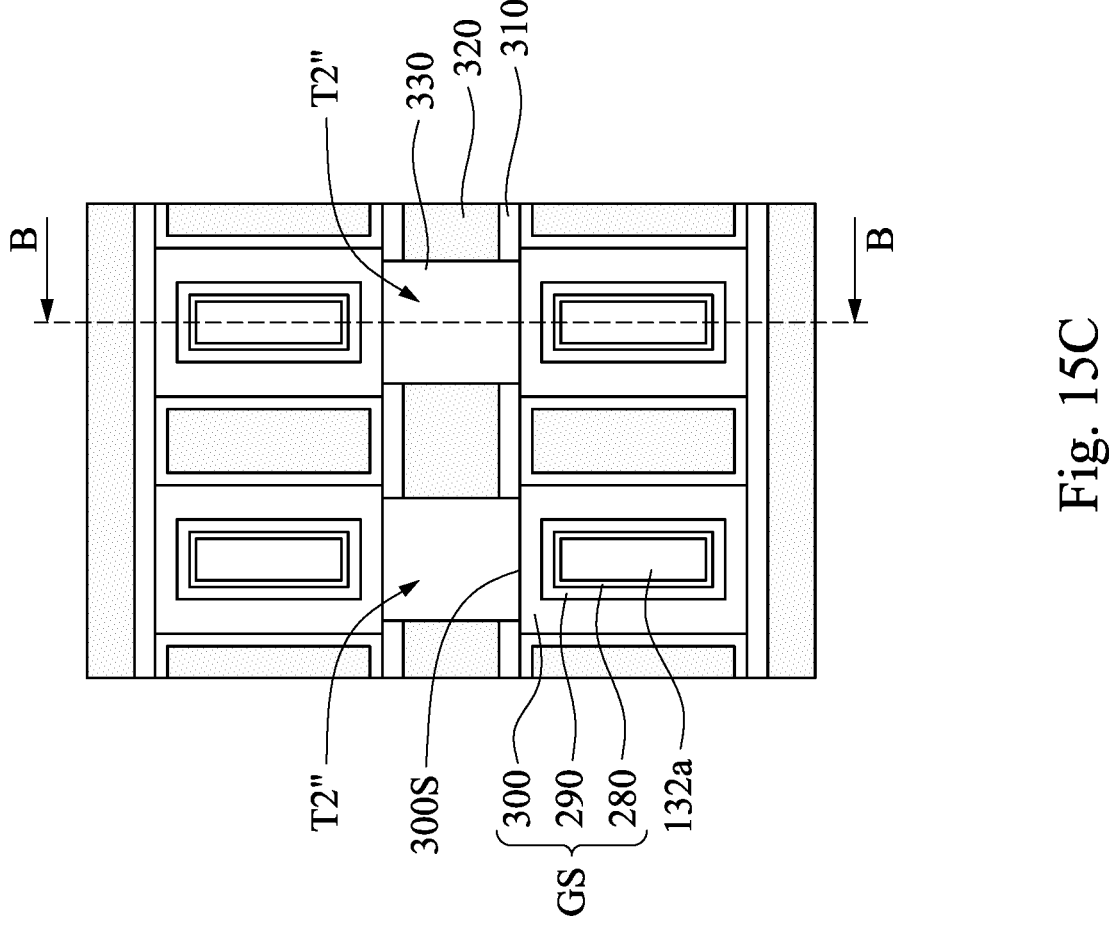

Reference is made to FIGS. 15A-15C. Portions of the trench isolation structures 320 and the dielectric liner layer 310 are removed, leaving trenches T2" exposing the sidewalls 300S of the gate metals 300. The removal may include forming patterned masks over the structure (referring to FIGS. 14A-14C), and then etching the trench isolation structures 320 and the dielectric liner layer 310 by using the masks as etch mask. In some embodiments, the patterned masks may be a hard mask formed by suitable photolithography and etching processes. In some embodiments, the masks may be photoresist mask formed by suitable photolithography process. After etching process, the formed trenches T2" is surrounded by the second portion 294 of the high-k dielectric layer 290.

A conductive feature 330 is formed in the trenches T2" and in contact with the sidewalls 300S of the gate metals 300. The conductive feature 330 may include one or more metal materials (e.g., W, Ru, Co, Cu, Ti, TiN, Ta, TaN, Mo, Ni, the like or combinations thereof). The conductive feature 330 can be formed by using suitable deposition techniques (e.g., PVD, ALD, the like or combinations thereof). The configuration of conductive features 330 follows the pattern of the trench T2". For example, in the present embodiments, each of the trenches T2" may expose the sidewalls 100S of two gate metals 300 of two gate structures GS, and each of the conductive features 330 may connect two gate metals 300 of two gate structures GS to each other. In some other embodiments, each of the trenches T2" may expose the sidewalls 100S of four gate metals 300 of four gate structures GS, and each of the conductive features 330 may connect four gate metals 300 of four gate structures GS to each other, as illustrated later in FIG. 18.

A protective layer 340 is formed in the trenches T2" and over the conductive feature 330 by a self-aligned manner. The protective layer 340 may include a suitable dielectric material, such as $SiO_2$, SiN, SiCN, SiOCN, low-k dielectrics, or the like, and may be formed by a suitable deposition method, such as CVD, or the combination thereof. The protective layer 340 can also be referred to as self-aligned carbide (SAC). In some embodiments, the protective layer 340 comprises the third-type dielectric material. The deposited dielectric material is thinned and planarized, for example by a chemical mechanical polishing (CMP) process. In some embodiments, the hard masks 270 functions as a CMP stop layer, so that the top surfaces of the protective layer 340 may be substantially coplanar with the top surface of the hard masks 270 after the CMP process is completed.

Figure 16:
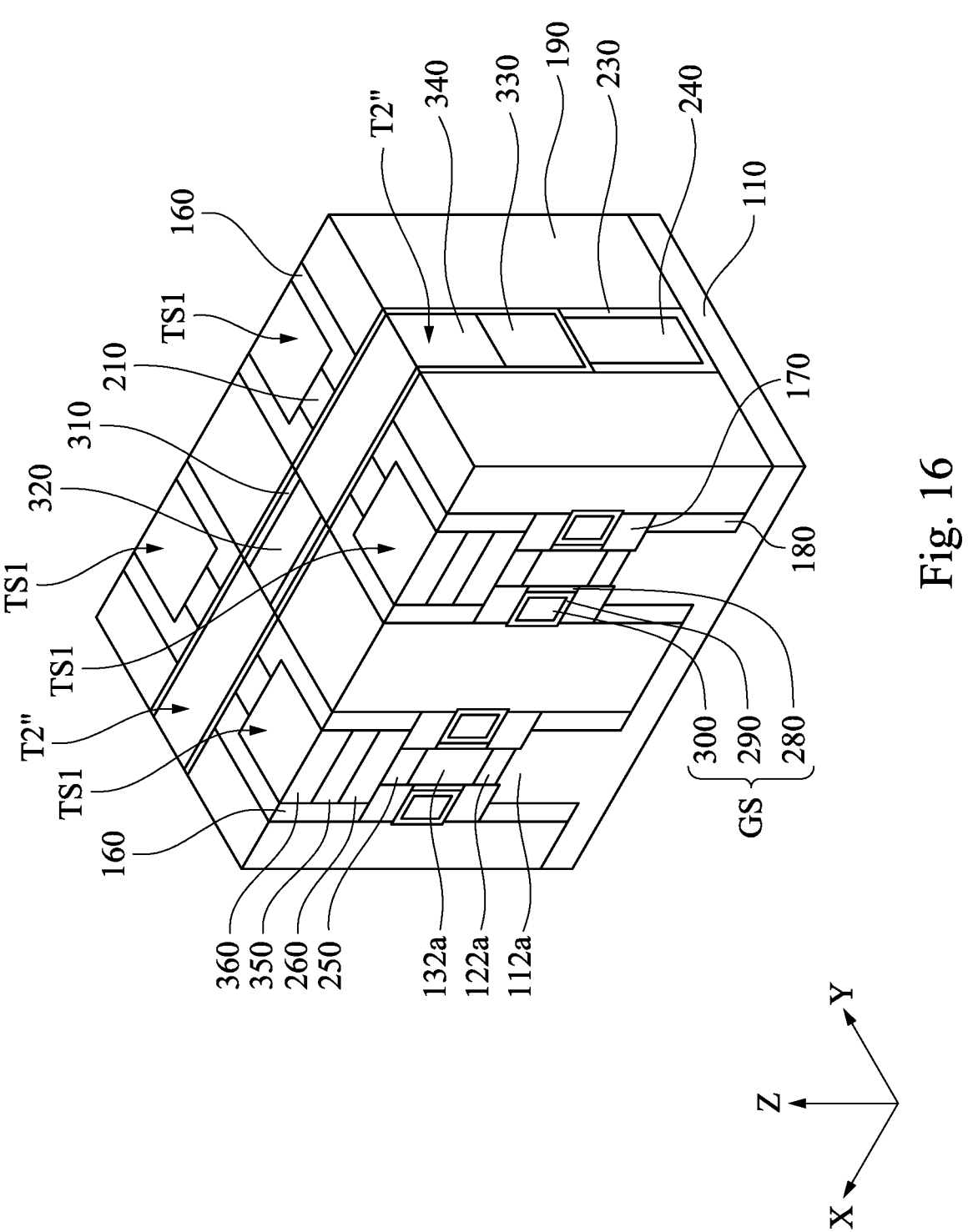

Reference is made to FIG. 16. The hard masks 270 are replaced by metal silicide region 350 and source/drain contact pads 360. In the context, contact pads may also be referred to as contacts. For example, the hard masks 270 are removed, leaving trenches/spaces TS1 between the spacers 160 and exposing top surfaces of the source/drain epitaxial structures 260. Subsequently, the metal silicide region 350 and the source/drain contact pads 360 are formed in the trenches/spaces TS1 between the spacers 160.

The metal silicide regions 350 are formed on exposed top surfaces of the source/drain epitaxial structures 260 by using a silicidation process. Silicidation may be formed by blanket depositing a metal layer over the exposed source/drain epitaxial structures 260, annealing the metal layer such that the metal layer reacts with silicon (and germanium if present) in the source/drain epitaxial structures 260 to form the metal silicide regions 350, and thereafter removing the non-reacted metal layer. In some embodiments, the metal layer used in the silicidation process includes nickel, cobalt, titanium, tantalum, platinum, tungsten, other noble metals, other refractory metals, rare earth metals or their alloys.

The source/drain contact pads 360 are formed over the metal silicide regions 350. In some embodiments, the formation step of the source/drain contact pads 360 includes depositing one or more metal materials (e.g., W, Ru, Co, Cu, Ti, TiN, Ta, TaN, Mo, Ni, the like or combinations thereof) to fill the trenches/spaces TS1 between the spacers 160 by using suitable deposition techniques (e.g., CVD, PVD, ALD, the like or combinations thereof), followed by a CMP process to remove excess metal materials outside the trenches/spaces TS1 between the spacers 160, while leaving metal materials in the trenches/spaces TS1 to serve as the source/drain contact pads 360.

Figure 17A:
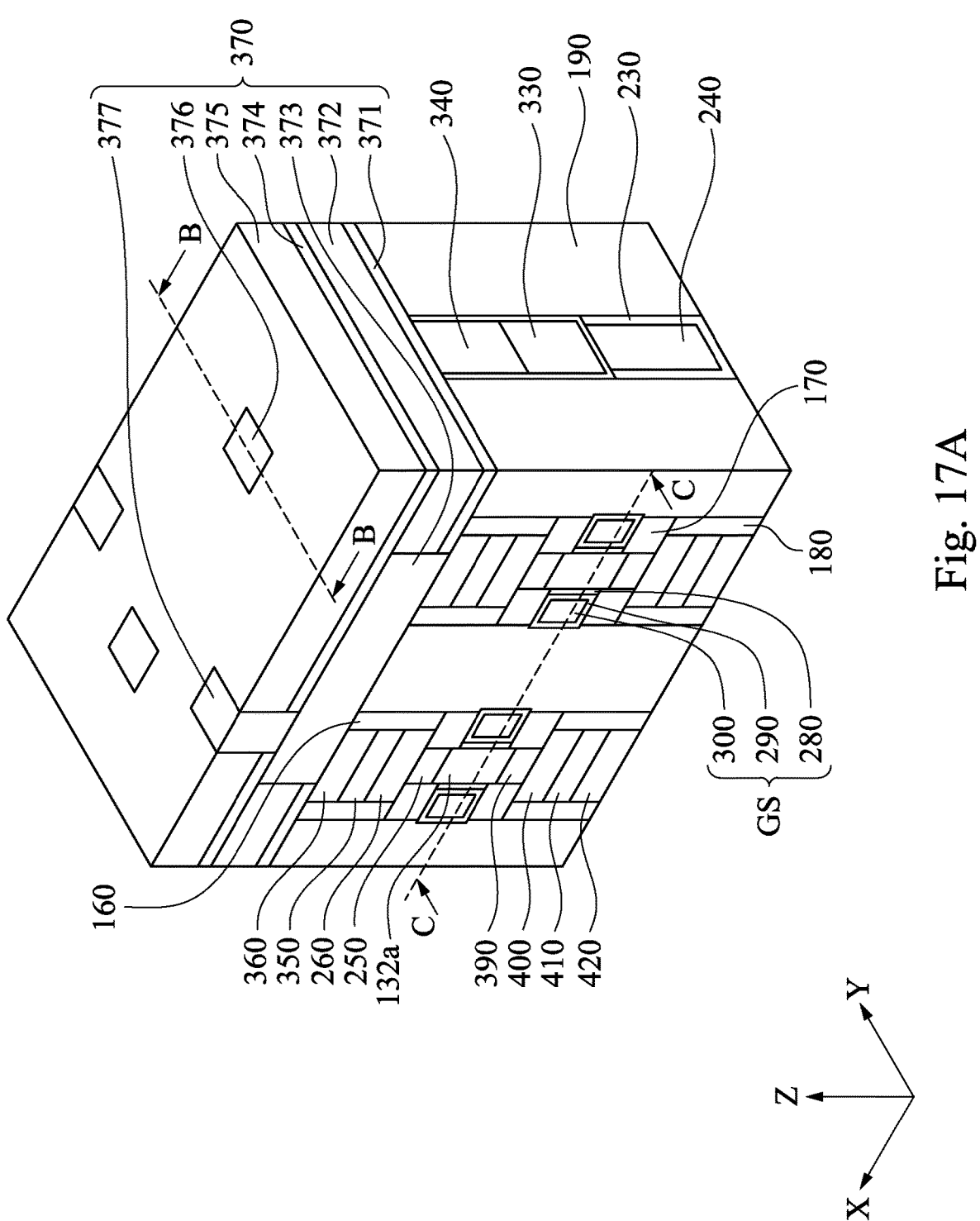
Figure 17B:
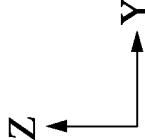
Figure 17C:
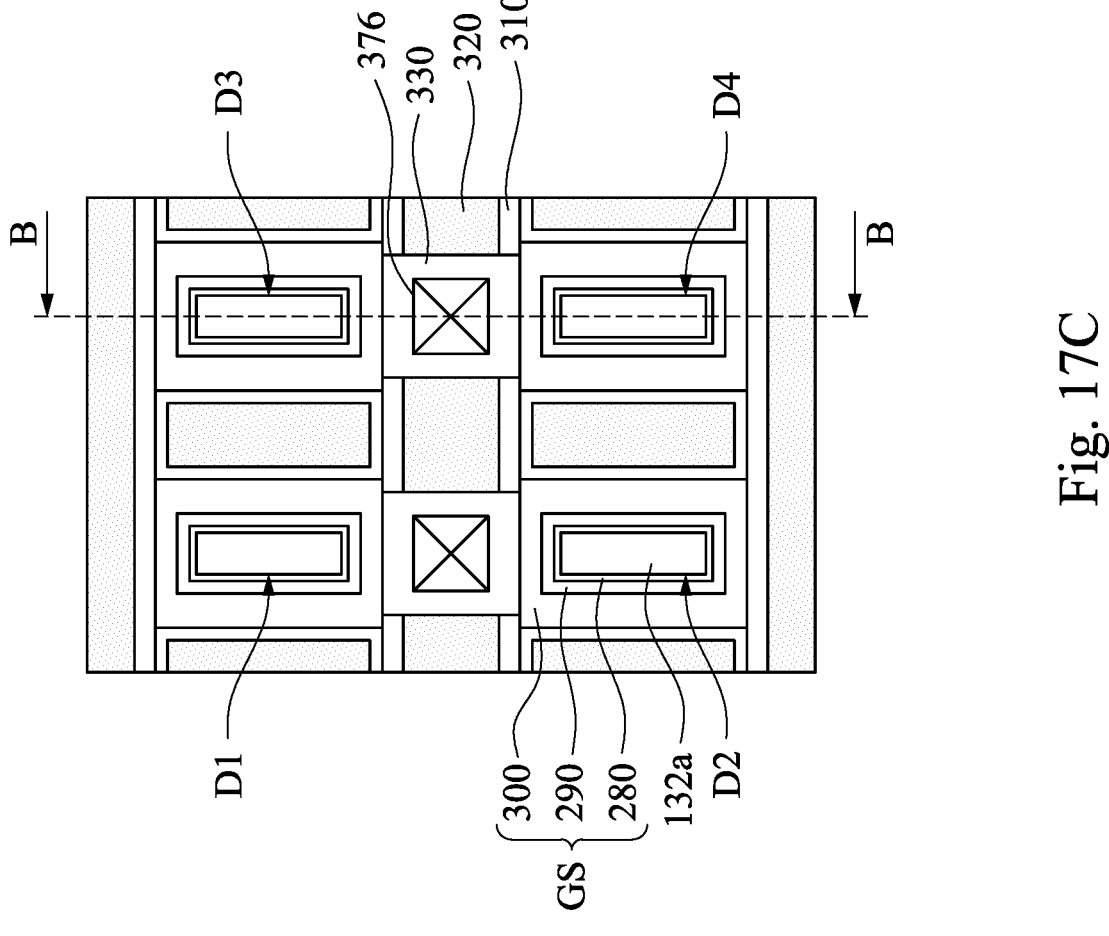

Reference is made to FIGS. 17A-17C. A middle-end-of-line (MEOL) process is formed to form source/drain conductive features 373 and 377 and gate metal vias 376. The source/drain conductive features 373 lands on the source/drain contact pads 360. The gate metal vias 376 lands on the conductive feature 330. In some embodiments, an etch stop layer 371 is first deposited over the structure of FIG. 16, and a dielectric layer 372 is subsequently deposited over the etch stop layer 371. The etch stop layer 371 may include silicon nitride, silicon oxynitride, silicon oxide, silicon carbide, high-k dielectrics, the like, or the combination thereof. The dielectric layer may include silicon oxide, silicon nitride, silicon oxynitride, fluorine-doped silicate glass (FSG), a low-k dielectric, combinations thereof, and/or other suitable materials. In some embodiments, the etch stop layer 371 may include the first-type dielectric material. The dielectric layer 372 may include the fifth-type dielectric material. The source/drain conductive features 373 are formed by etching via openings in the dielectric layer 372 and the etch stop layer 371 to expose the source/drain contact pads 360, and fill metals into the via openings, followed by a CMP process. Then, an etch stop layer 374 is deposited over the dielectric layer 372, and a dielectric layer 375 is subsequently deposited over the etch stop layer 374. The etch stop layer 374 and the dielectric layer 375 may comprises materials respectively similar to the etch stop layer 374 and the dielectric layer 375, and not repeated herein. The source/drain conductive features 377 are formed by etching via openings in the dielectric layer 375 and the etch stop layer 374 to expose the source/drain conductive features 373, and fill metals into the via openings, followed by a CMP process. The gate metal vias 376 are formed by etching via openings in the dielectric layer 375, the etch stop layer 374, the dielectric layer 372, the etch stop layer 371, and the protective layer 340 to expose the conductive feature 330, and fill metals into the via openings, followed by a CMP process. In some embodiments, metals for the source/drain conductive features 373 and gate metal vias 376 may include W, Ru, Co, Cu, Ti, TiN, Ta, TaN, Mo, Ni, the like or combinations thereof.

A front-side multilayer interconnection (MLI) structure 380 may be formed on the front side of the substrate 110 (referring to FIG. 16). The front-side MLI structure 380 may have include a plurality of front-side metallization layers 382. The number of front-side metallization layers 382 may vary according to design specifications of the integrated circuit. Only two front-side metallization layers 382 are illustrated in FIG. 17B for the sake of simplicity.

The front-side metallization layers 382 each comprise a front-side inter-metal dielectric (IMD) layer 3821. The front-side metallization layers 382 comprise one or more horizontal interconnects, such as front-side metal lines 382M, respectively extending horizontally or laterally in the front-side IMD layers 3821 and vertical interconnects, such as front-side conductive vias 382V, respectively extending vertically in the front-side IMD layers 3821. In some embodiments, some of the front-side metal lines 382M in the bottommost front-side metallization layer 382 (closest to the channel layer 132a) are respectively in contact with the source/drain conductive feature 377 to make electrical connection to the source/drain conductive feature 373, the source/drain contact pad 360, and source/drain epitaxial features 260. In some embodiments, some of the front-side metal lines 382M in the bottommost front-side metallization layer 382 (closest to the channel layer 132a) are respectively in contact with the gate metal vias 376 to make electrical connection to the conductive feature 330 and the gate structure GS.

The front-side metal lines 382M and front-side metal vias 382V can be formed using, for example, a single damascene process, a dual damascene process, the like, or combinations thereof. In some embodiments, the front-side IMD layers 3821 may include low-k dielectric materials having k values, for example, lower than about 4.0 or even 2.0 disposed between such conductive features. In some embodiments, the front-side IMD layers may be made of, for example, phosphosilicate glass (PSG), borophosphosilicate glass (BPSG), fluorosilicate glass (FSG), $SiO_xC_y$, Spin-On-Glass, Spin-On-Polymers, silicon oxide, silicon oxynitride, combinations thereof, or the like, formed by any suitable method, such as spin-on coating, chemical vapor deposition (CVD), plasma-enhanced CVD (PECVD), or the like. The front-side metal lines and vias 382M and 382V may comprise metal materials such as copper, aluminum, tungsten, combinations thereof, or the like. In some embodiments, the front-side metal lines and vias 382M and 382V may further comprise one or more barrier/adhesion layers (not shown) to protect the respective front-side IMD layers 3821 from metal diffusion (e.g., copper diffusion) and metallic poisoning. The one or more barrier/adhesion layers may comprise titanium, titanium nitride, tantalum, tantalum nitride, or the like, and may be formed using physical vapor deposition (PVD), CVD, ALD, or the like. In some embodiments, the front-side metal lines 382M and front-side metal vias 382V in combination may be referred to as a front-side metallization pattern. In the context, the metal lines 382M and metal vias 382V may also be referred to as conductive features.

After the formation of the front-side MLI structure 380, a carrier substrate is bonded to the front-side MLI structure 380 in accordance with some embodiments of the present disclosure. Then, the substrate 110 (referring to FIG. 16) is thinned down to expose the spacers 180, the trench isolation structures 190, and the dielectric liner layer 230. In some embodiments, thinning is accomplished by a CMP process, a grinding process, or the like. In some embodiments, the substrate 110 (referring to FIG. 16) is removed by the thinning process.

The substrate portion 112a and the sacrificial layer 122a (referring to FIG. 16) are replaced by an epitaxial layer 390, a source/drain epitaxial structure 400, a metal silicide region 410, and a source/drain contact pad 420. For example, an etching process is performed to remove the substrate portion 112a and the sacrificial layer 122a (referring to FIG. 16), leaving bottoms of the channel layers 132a exposed. Then, the epitaxial layer 390, the source/drain epitaxial structure 400, the metal silicide region 410 and a source/drain contact pad 420 are formed in a sequence into the spaces between the spacers 170, 210, and the spacers 180. Formation and details of the epitaxial layer 390 and the source/drain epitaxial structure 400, the metal silicide region 410, and the source/drain contact pad 420 are respectively similar to the formation of the epitaxial layer 250 and the source/drain epitaxial structure 260, the metal silicide region 350, and the source/drain contact pad 360, and therefore not repeated herein.

A back-side MLI structure 430 may be formed on the back side of the structure. The back-side MLI structure 430 may have include a plurality of back-side metallization layers 432. The number of back-side metallization layers 432 may vary according to design specifications of the integrated circuit. Only two back-side metallization layers 432 are illustrated in FIG. 17B for the sake of simplicity.

The back-side metallization layers 432 each comprise a back-side inter-metal dielectric (IMD) layer 4321. The back-side metallization layers 432 comprise one or more horizontal interconnects, such as back-side metal lines 432M, respectively extending horizontally or laterally in the back-side IMD layers 4321 and vertical interconnects, such as back-side conductive vias 432V, respectively extending vertically in the back-side IMD layers 4321. In some embodiments, the back-side metal lines 432M in the topmost back-side metallization layer 432 (closest to the channel layer 132a) are respectively in contact with the source/drain contact pads 420 to make electrical connection to the source/drain epitaxial features 400.

In some embodiments, the front-side metal lines 382M in the bottommost front-side metallization layer 382 (closest to the channel layer 132a) comprises Vdd power rails and Vss power rails (referred to as power rails 382MP), and the back-side metal lines 432M in the topmost back-side metallization layer 432 (closest to the channel layer 132a) comprises Vdd power rails and Vss power rails (referred to as power rails 432MP). The power rails 432MP can also referred to as super power rails (SPR). For each of the VFET devices, depending on requirements, one of the source/drain contact pad 360 and 420 can be connected to one of a Vss/Vdd power rail 382MP of the front-side MLI structure 380 and a Vss/Vdd power rail 432MP of the back-side MLI structure 430, and another one of the source/drain contact pad 360 and 420 can be connected to a signal line of another one of the front-side MLI structure 380 and the back-side MLI structure 430. In FIG. 17B, for clear illustration the electrical connections, positions of the source/drain conductive features 377 is depicted by dashed lines.

In the present embodiments, plural VFETs D1-D4 are formed. Each of the VFETs D1-D4 includes a channel layer 132a, a source/drain epitaxial structure 260, a source/drain contact pad 360, a source/drain epitaxial structure 400, and a source/drain contact pad 420. In some embodiments, the VFETs D1 and D3 are of a same first type (e.g., p type), and the VFETs D1 and D3 are of a same second type (e.g., n type). In some embodiments, the VFETs D1 and D3 are of a same first type (e.g., n type), and the VFETs D1 and D3 are of a same second type (e.g., p type). In some embodiments, the VFETs D1-D4 are of a same type (e.g., either p type or n type). Referring to FIG. 17C, the longitudinal direction of the channel layer 132a of the VFET D1 is aligned to the longitudinal direction of the channel layer 132a of the VFET D2 along the direction X, and the longitudinal direction of the channel layer 132a of the VFET D3 is aligned to the longitudinal direction of the channel layer 132a of the VFET D4 along the direction X. One of the conductive features 330 may connects the channel layers 132a of the VFETs D1 and D2 to each other. Another of the conductive features 330 may connects the channel layers 132a of the VFETs D3 and D4 to each other.

Figure 18:
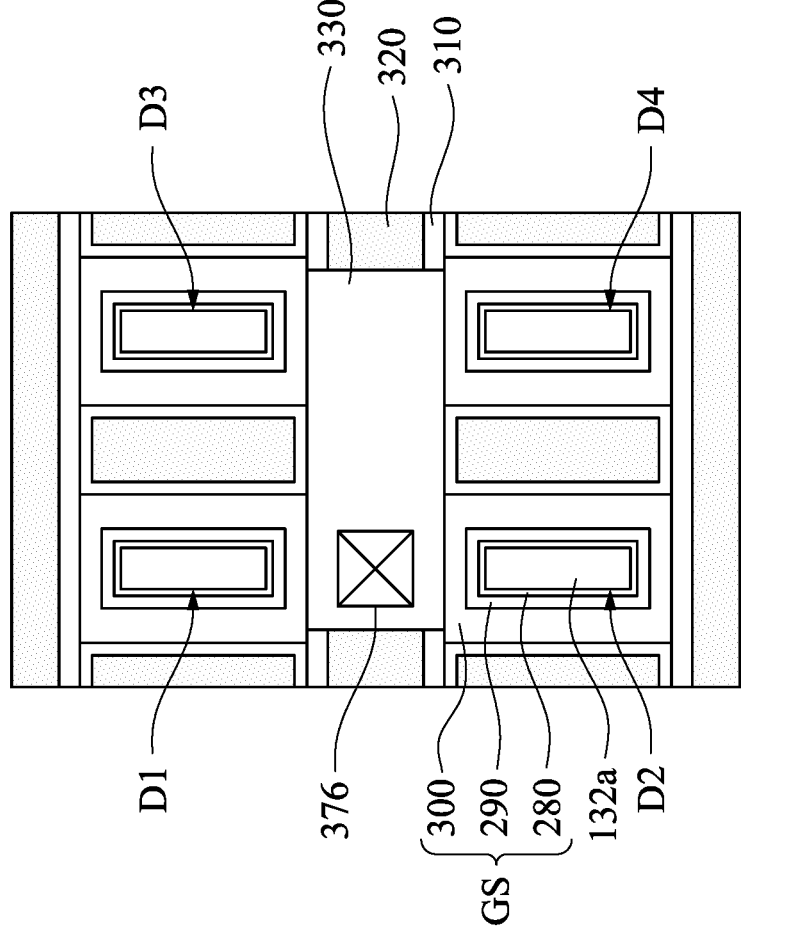
FIG. 18 illustrates a plan top view of an integrated circuit structure having a VFET, in accordance with some embodiments of the present disclosure.

FIG. 18 illustrates a plan top view of an integrated circuit structure having a VFET, in accordance with some embodiments of the present disclosure. Details of the present embodiments are similar to those of embodiments of FIGS. 1-17C, except that each of the trenches T2″ may expose the sidewalls 100S of four gate metals 300 of four gate structures GS, and each of the conductive features 330 may connect four gate metals 300 of four gate structures GS to each other, as illustrated later in FIG. 18. The gate metal vias 376 may establish the electrical connection between the four gate structures GS to the front-side MLI structure 380. One conductive feature 330 may connects the channel layers 132a of the VFETs D1-D4 to each other. Other details of the present disclosure are similar to those embodiments of FIGS. 1-17C, and not repeated herein.

In various embodiments, for illustration purpose, the gate structure GS and the conductive feature 300 (referring to FIGS. 1-18) in combination referred to a gate structure GS'.

Figure 19B:
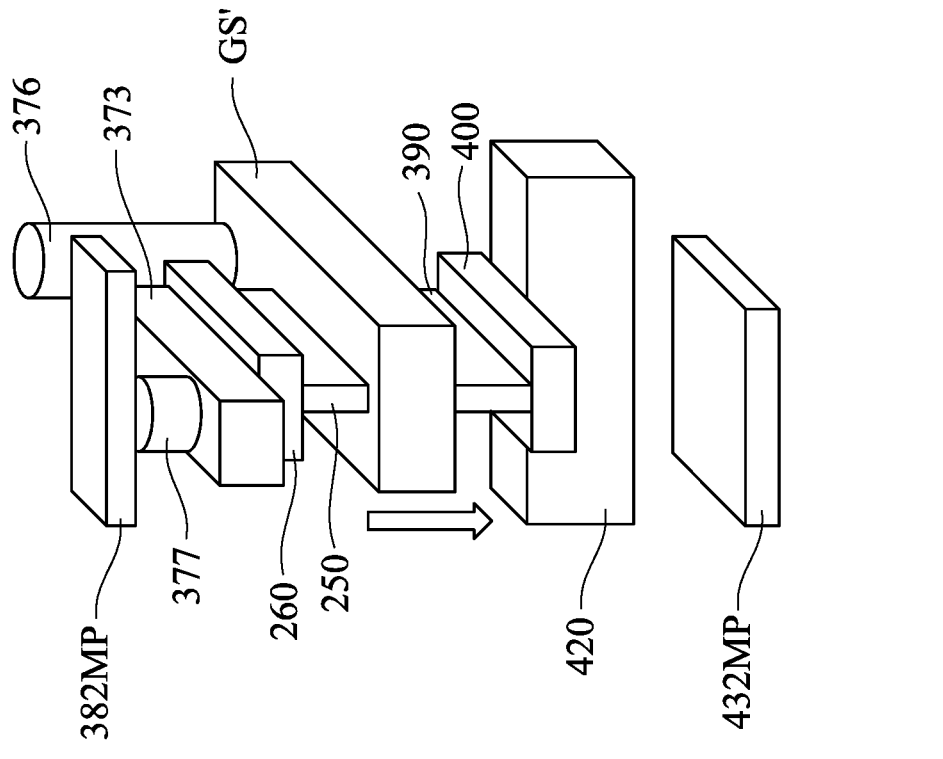
FIG. 19B is a perspective view of an integrated circuit structure having a VFET, in accordance with some embodiments of the present disclosure.
Figure 19A:
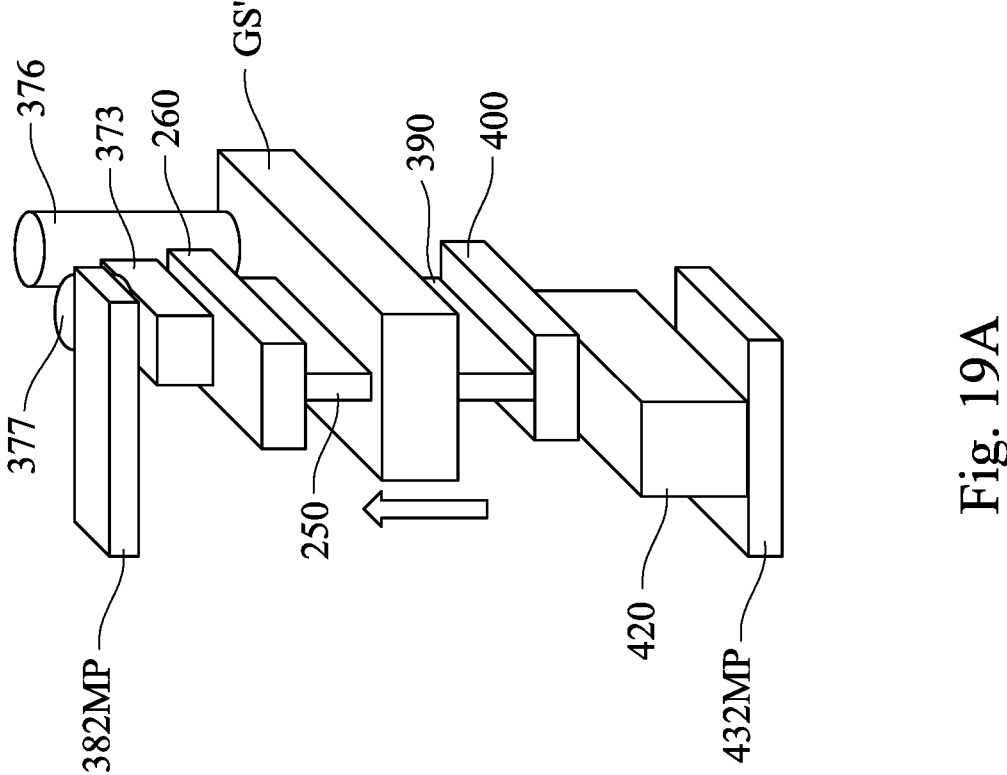
FIG. 19A is a perspective view of an integrated circuit structure having a VFET, in accordance with some embodiments of the present disclosure.

FIG. 19A is a perspective view of an integrated circuit structure having a VFET, in accordance with some embodiments of the present disclosure. Arrows indicates the current transport direction. In FIG. 19A, the VFET has a source/drain epitaxial structure 400 electrically connected to the Vss/Vdd power rail 432MP and a source/drain epitaxial structure 260 electrically disconnected from the Vss/Vdd power rail 382MP. In some embodiments, an extending direction of the Vss/Vdd power rail 382MP is parallel with an extending direction of the Vss/Vdd power rail 432MP when viewed from top, and the Vss/Vdd power rails 382MP and 432MP are at the same power potential according to the device. For example, a n-type VFET is located vertically between or near Vss power rails 382MP and 432MP, or a p-type VFET is located vertically between or near Vdd power rails 382MP and 432MP. As a result, carriers flows from the Vss/Vdd power rail 432MP through the source/drain contact pad 420 to the source/drain epitaxial structure 400, and under the control of the gate structure GS, flow from the source/drain epitaxial structure 260 to the source/drain conductive feature 377 through the source/drain conductive feature 373. The source/drain conductive feature 377 is spaced apart and electrically isolated from the Vss/Vdd power rail 382MP.

FIG. 19B is a perspective view of an integrated circuit structure having a VFET, in accordance with some embodiments of the present disclosure. Arrows indicates the current direction. In FIG. 19B, the VFET has a source/drain epitaxial structure 260 electrically connected to the Vss/Vdd power rail 382MP and a source/drain epitaxial structure 400 electrically disconnected from the Vss/Vdd power rail 432MP. In some embodiments, an extending direction of the Vss/Vdd power rail 382MP is parallel with an extending direction of the Vss/Vdd power rail 432MP when viewed from top, and the Vss/Vdd power rails 382MP and 432MP are at the same power potential according to the device. For example, a n-type VFET is located vertically between or near Vss power rails 382MP and 432MP, or a p-type VFET is located vertically between or near Vdd power rails 382MP and 432MP. As a result, carriers flow from the Vss/Vdd power rail 382MP through the source/drain conductive feature 377 and the source/drain conductive feature 373 to the source/drain epitaxial structure 260, and under the control of the gate structure GS, flow from the source/drain epitaxial structure 400 to the source/drain contact pad 420. The source/drain contact pad 420 is spaced apart and electrically isolated from the Vss/Vdd power rail 432MP.

Figure 20A:
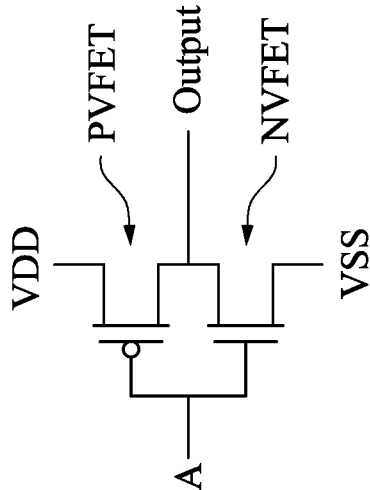
FIG. 20A is a circuit diagram of an inverter.
Figure 20C:
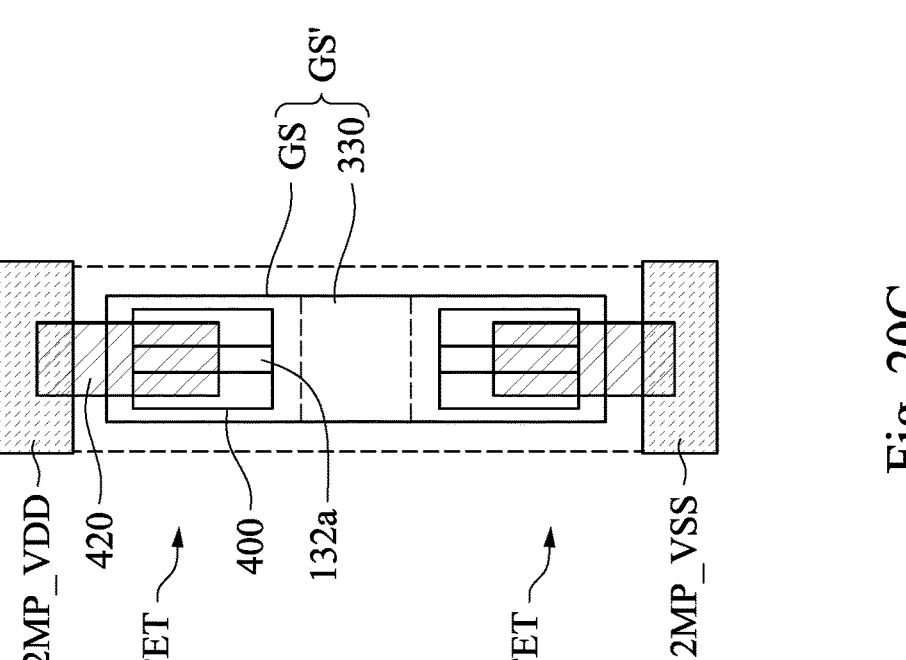
FIG. 20C is a bottom-side layout of the invertor of FIG. 20A.
Figure 20B:
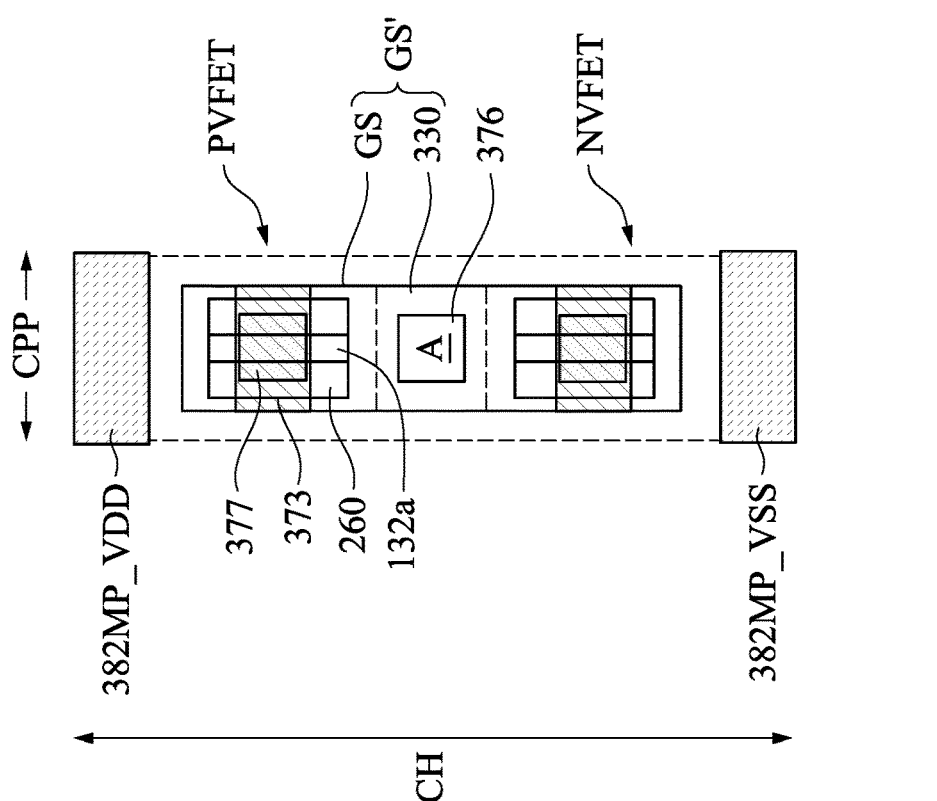
FIG. 20B is a top-side layout of the invertor of FIG. 20A.

FIG. 20A is a circuit diagram of an inverter. FIG. 20B is a top-side layout of the invertor of FIG. 20A. FIG. 20C is a bottom-side layout of the invertor of FIG. 20A. The invertor includes a p-type transistor PVFET and a n-type transistor NVFET. In the present embodiments, the backside Vss power rail 432MP_Vss and backside Vdd power rail 432MP_Vdd respectively provide the potential VSS and VDD to the transistors NVFET and PVFET, while the transistors NVFET and PVFET are disconnected from the frontside Vss power rail 382MP_Vss and frontside Vdd power rail 382MP_Vdd. Through the configuration, the output of the invertor circuit is the opposite of its input at the node A. Gate metal vias 376 can be used as input nodes A of the inverter. In some other embodiments, either one of the Vdd power rails 382MP_Vdd and 432MP_Vdd is used for providing the potential VDD to the transistor PVFET of the inverter, and either one of the Vss power rails 382MP_Vss and 432MP_Vss is used for providing the potential VSS to the transistors NVFET of the inverter. In some embodiments of the present disclosure, a cell height CH of the invertor circuit is reduced since the bottom source/drain feature of the transistors PVFET and NVFET can be connected to back-side MLI. Furthermore, a required number of the poly pitch CPP of the invertor circuit is one, thereby increasing device density.

Figure 21A:
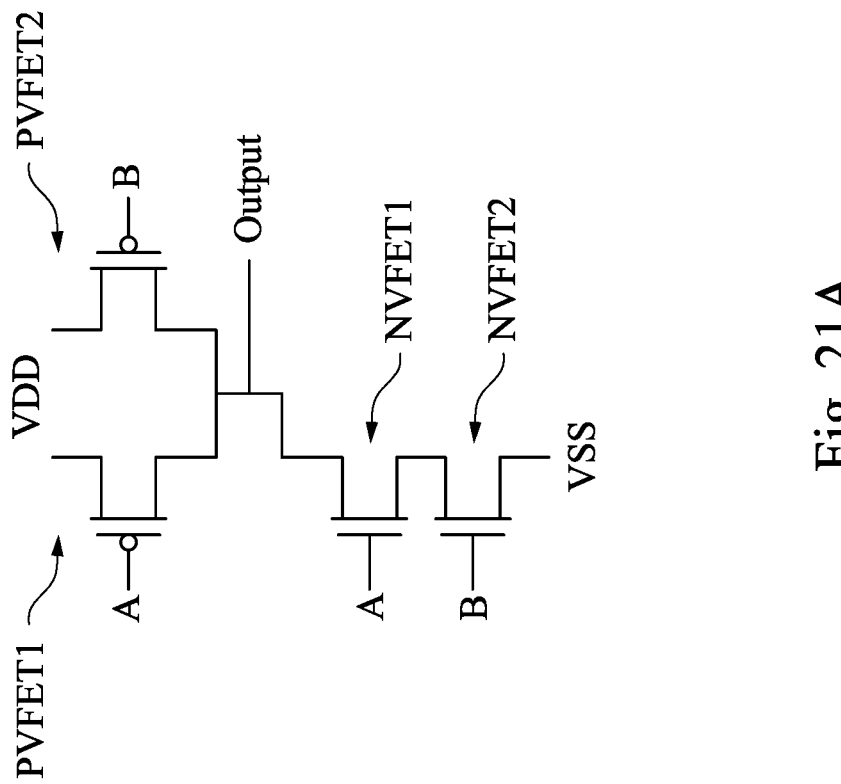
FIG. 21A is a circuit diagram of a NAND gate.
Figures 21B, 21C:
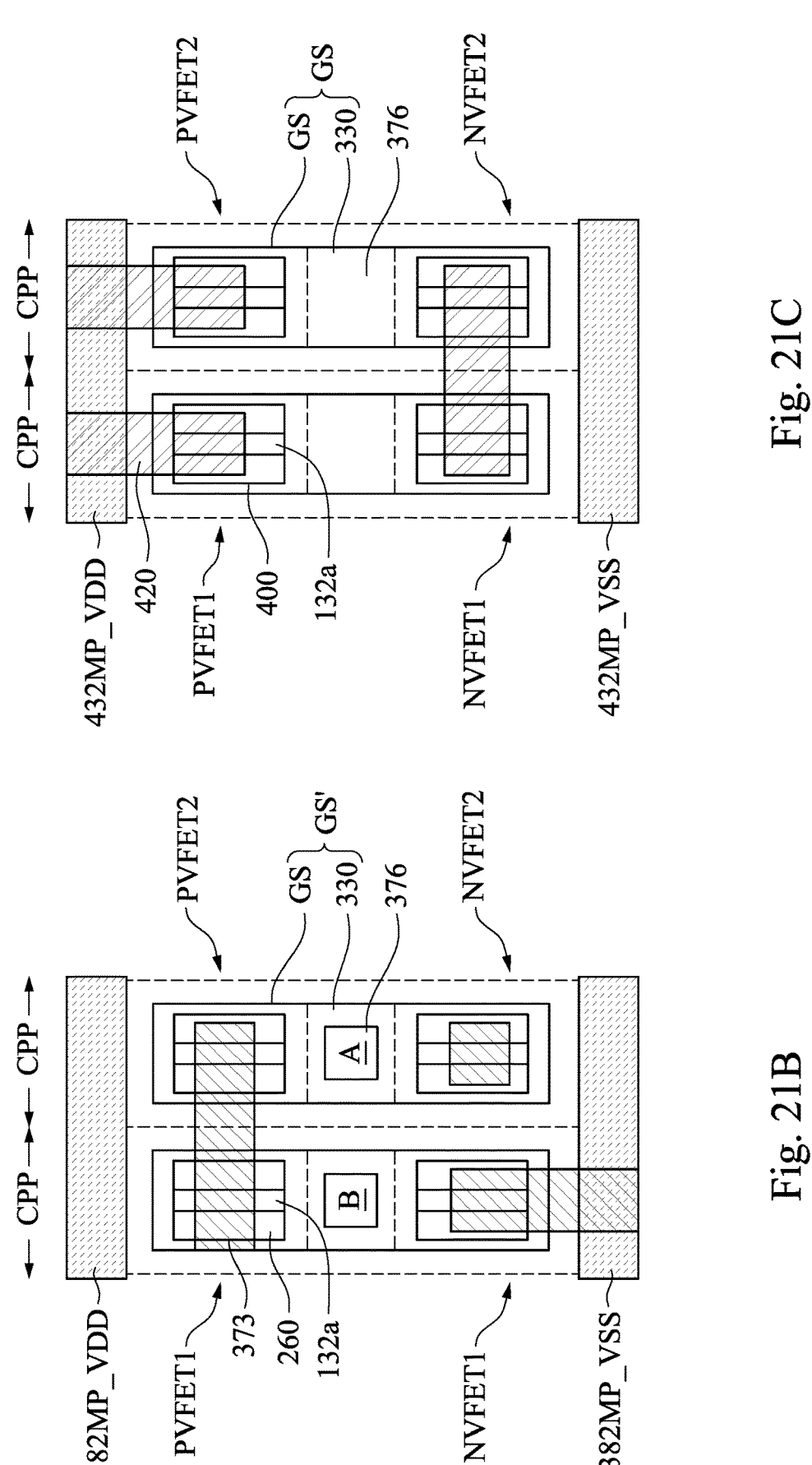
FIG. 21B is a top-side layout of the NAND gate of FIG. 21A.
FIG. 21C is a bottom-side layout of the NAND gate of FIG. 21A.

FIG. 21A is a circuit diagram of a NAND gate. FIG. 21B is a top-side layout of the NAND gate of FIG. 21A. FIG. 21C is a bottom-side layout of the NAND gate of FIG. 21A. The NAND gate includes two p-type transistors PVFET1 and PVFET2 and two n-type transistors NVFET1 and NVFET2. In the present embodiments, the frontside Vss power rail 382MP_Vss and backside Vdd power rail 432MP_Vdd respectively provide the potential VSS and VDD to the transistors PVFET1, PVFET2, NVFET1 and NVFET2, while the transistors PVFET1, PVFET2, NVFET1 and NVFET2 are disconnected from the backside Vss power rail 432MP_Vss and frontside Vdd power rail 382MP_Vdd. Through the configuration, the output of the NAND gate circuit is false only if all its inputs at nodes A and B are true. Various gate metal vias 376 can be used as input nodes A and B of the NAND gate. In some other embodiments, either one of the Vdd power rails 382MP_Vdd and 432MP_Vdd and either one of the Vss power rails 382MP_Vss and 432MP_Vss are used for providing the potential VSS and VDD to the transistors PVFET1, PVFET2, NVFET1 and NVFET2 of the NAND gate. In embodiments of the present disclosure, in addition to the reduced cell height of VFETs, a required number of the poly pitch CPP of the NAND gate is two, thereby increasing device density.

Figure 22A:
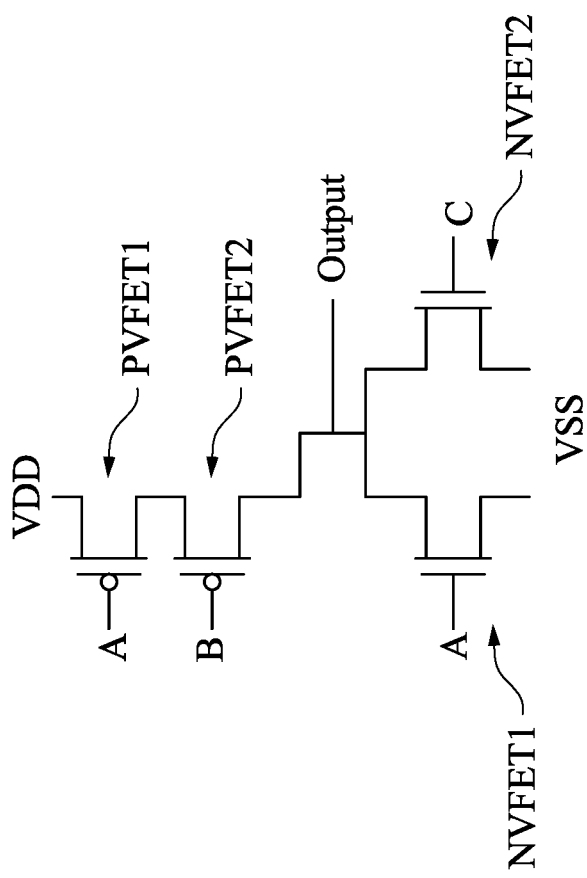
FIG. 22A is a circuit diagram of a NOR gate.
Figures 22B, 22C:
FIG. 22B is a top-side layout of the NOR gate of FIG. 22A.
FIG. 22C is a bottom-side layout of the NOR gate of FIG. 22A.

FIG. 22A is a circuit diagram of a NOR gate. FIG. 22B is a top-side layout of the NOR gate of FIG. 22A. FIG. 22C is a bottom-side layout of the NOR gate of FIG. 22A. The NOR gate includes two p-type transistors PVFET1 and PVFET2 and two n-type transistors NVFET1 and NVFET2. In the present embodiments, the backside Vss power rail 432MP_Vss and frontside Vdd power rail 382MP_Vdd respectively provide the potential VSS and VDD to the transistors PVFET1, PVFET2, NVFET1 and NVFET2, while the transistors PVFET1, PVFET2, NVFET1 and NVFET2 are disconnected from the frontside Vss power rail 382MP_Vss and backside Vdd power rail 432MP_Vdd. Through the configuration, the output of the NOR gate circuit is true only if all its inputs at nodes A and B are false. Various gate metal vias 376 can be used as input nodes A and B of the NOR gate. In some other embodiments, either one of the Vdd power rails 382MP_Vdd and 432MP_Vdd and either one of the Vss power rails 382MP_Vss and 432MP_Vss are used for providing the potential VSS and VDD to the transistors PVFET1, PVFET2, NVFET1 and NVFET2 of the NOR gate. In embodiments of the present disclosure, in addition to the reduced cell height of VFETs, a required number of the poly pitch CPP of the NOR gate is two, thereby increasing device density.

Figure 23A:
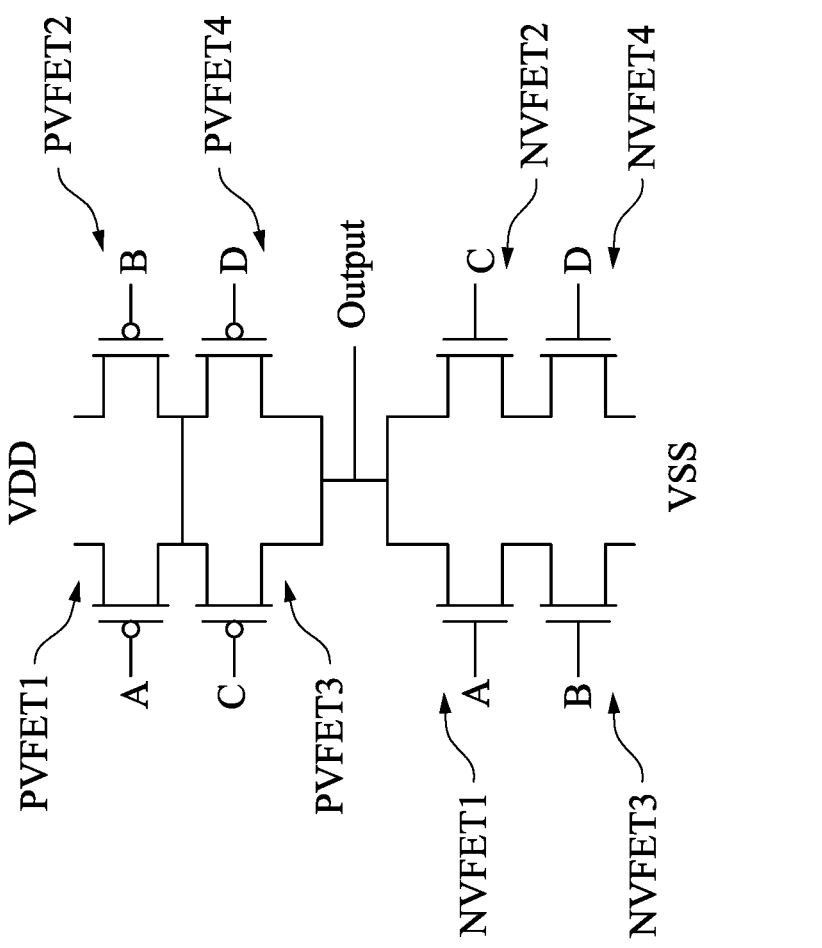
FIG. 23A is a circuit diagram of an AOI22D1 circuit.
Figures 23B, 23C:
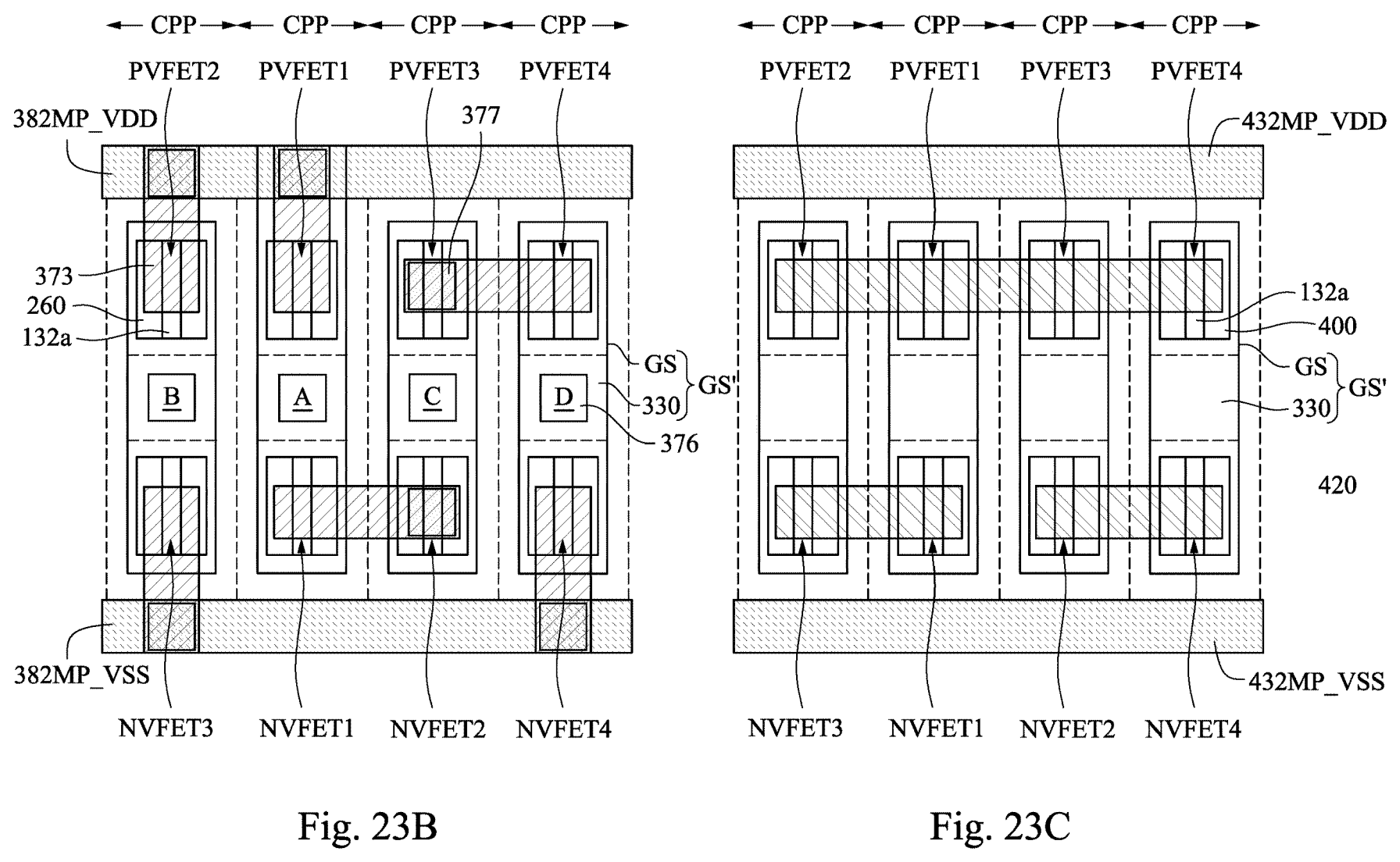

FIG. 23A is a circuit diagram of an AOI22D1 circuit. FIG. 23B is a top-side layout of the AOI22D1 circuit of FIG. 23A. FIG. 23C is a bottom-side layout of the AOI22D1 circuit of FIG. 23A. The AOI22D1 circuit includes four p-type transistors PVFET1-PVFET4 and two n-type transistors NVFET1-NVFET4. In the present embodiments, the frontside Vss power rail 382MP_Vss and frontside Vdd power rail 382MP_Vdd respectively provide the potential VSS and VDD to the transistors PVFET 1-PVFET4 and NVFET1-NVFET4, while the transistors PVFET1-PVFET4 and NVFET1-NVFET4 are disconnected from the backside Vss power rail 432MP_Vss and backside Vdd power rail 432MP_Vdd. Various gate metal vias 376 can be used as input nodes A-D of the AOI22D1 circuit. In some other embodiments, either one of the Vdd power rails 382MP_Vdd and 432MP_Vdd and either one of the Vss power rails 382MP_Vss and 432MP_Vss are used for providing the potential VSS and VDD to the transistors PVFET1-PVFET4 and NVFET1-NVFET4 of the NAND gate. In embodiments of the present disclosure, in addition to the reduced cell height of VFETs, a required number of the poly pitch CPP of the AOI22D1 circuit is four, thereby increasing device density.

Based on the above discussions, it can be seen that the present disclosure offers advantages. It is understood, however, that other embodiments may offer additional advantages, and not all advantages are necessarily disclosed herein, and that no particular advantage is required for all embodiments. One advantage is that the current transport direction of VFET is designable by dual-side backside power rails and layouts of frontside and backside conductive features. Another advantage is that by the VFET configuration can reduce the required poly pitch number of INV/NAND/NOR gates. Still another advantage is that the VFET layout style makes the isolation breaking for diffusion is not necessary, and VFET has extreme lower parasitic capacitance, thereby boosting performance and scaling cell area. Still another advantage is that the VFET layout combining backside power rail is optimized to have aggressive cell height scaling since the bottom source/drain feature can be connected to back-side MLI.

In some embodiments of the present disclosure, a method includes forming an epitaxial stack over a semiconductor substrate, wherein the epitaxial stack comprises a first sacrificial layer, a channel layer over the first sacrificial layer, and a second sacrificial layer over the channel layer; patterning the epitaxial stack into a fin structure such that opposite first ends of the channel layer are exposed; recessing the opposite first ends of the channel layer; forming first dummy spacers on the recessed opposite first ends of the channel layer; forming an isolation structure in the fin structure; recessing a top surface of the isolation structure to a position lower than a bottom surface of the channel layer, such that opposite second ends of the channel layer are exposed; recessing the opposite second ends of the channel layer; forming second dummy spacers on the recessed opposite second ends of the channel layer; and replacing the first dummy spacers and the second dummy spacers with a metal gate structure.

In some embodiments of the present disclosure, a method includes forming an epitaxial stack over a semiconductor substrate, wherein the epitaxial stack comprises a first sacrificial layer, a channel layer over the first sacrificial layer, and a second sacrificial layer over the channel layer; removing the first sacrificial layer from a frontside of the channel layer; forming a first source/drain epitaxial structure over the frontside of the channel layer; forming a metal gate structure laterally surrounding the channel layer; removing the semiconductor substrate to expose the second sacrificial layer; removing the second sacrificial layer from a backside of the channel layer; and forming a second source/drain epitaxial structure on the backside of the channel layer.

In some embodiments of the present disclosure, an integrated circuit structure includes a first vertical field-effect transistor, a conductive feature, and a gate metal via. The first vertical field-effect transistor includes a first bottom source/drain epitaxial structure, a first channel layer, a first top source/drain epitaxial structure, and a first gate structure. The first channel layer is over the first bottom source/drain epitaxial structure. The first top source/drain epitaxial structure is over the first channel layer. The first gate structure surrounds the first channel layer from a top view. The conductive feature is in contact with a sidewall of a gate metal of the first gate structure from the top view. The gate metal via is over the conductive feature.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
forming an epitaxial stack over a semiconductor substrate, wherein the epitaxial stack comprises a first sacrificial layer, a channel layer over the first sacrificial layer, and a second sacrificial layer over the channel layer;
patterning the epitaxial stack into a fin structure such that opposite first ends of the channel layer are exposed;
recessing the opposite first ends of the channel layer;
forming first dummy spacers on the recessed opposite first ends of the channel layer;
forming an isolation structure in the fin structure;
recessing a top surface of the isolation structure to a position lower than a bottom surface of the channel layer, such that opposite second ends of the channel layer are exposed;
recessing the opposite second ends of the channel layer;
forming second dummy spacers on the recessed opposite second ends of the channel layer; and
replacing the first dummy spacers and the second dummy spacers with a metal gate structure.

2. The method of claim 1, wherein replacing the first dummy spacers and the second dummy spacers with the metal gate structure comprises:
removing the first dummy spacers and the second dummy spacers to leave an opening on the opposite first ends and the opposite second ends of the channel layer;
depositing a high-k dielectric layer into the opening; and
depositing a gate metal into the opening.

3. The method of claim 1, further comprising:
forming a conductive feature over the recessed top surface of the isolation structure, wherein the conductive feature is in contact with a sidewall of a gate metal of the metal gate structure.

4. The method of claim 3, further comprising:
forming a gate metal via landing on the conductive feature.

5. The method of claim 1, wherein the first and second dummy spacers comprise a same dielectric material.

6. The method of claim 1, further comprising:
forming first spacers on opposite first ends of the first and second sacrificial layers; and
forming second spacers on opposite second ends of the first and second sacrificial layers, wherein the first and second spacers comprise a dielectric material different from the first and second dummy spacers.

7. The method of claim 1, further comprising:
removing the first sacrificial layer from the channel layer; and
forming a first source/drain epitaxial structure over the channel layer.

8. The method of claim 1, further comprising:
removing the second sacrificial layer from the channel layer; and
forming a second source/drain epitaxial structure below the channel layer.

9. A method comprising:
forming a semiconductor stack over a substrate, wherein the semiconductor stack comprises a first sacrificial layer, a channel layer over the first sacrificial layer, and a second sacrificial layer over the channel layer;
patterning the semiconductor stack into a fin structure such that opposite first ends of the channel layer are exposed;
etching the opposite first ends of the channel layer;
forming first dummy spacers on the etched opposite first ends of the channel layer;
forming an isolation structure in the fin structure;
recessing a top surface of the isolation structure to a position lower than a bottom surface of the channel layer, such that opposite second ends of the channel layer are exposed;
recessing the opposite second ends of the channel layer;
forming second dummy spacers on the recessed opposite second ends of the channel layer; and
replacing the first dummy spacers with a metal gate structure.

10. The method of claim 9, further comprising:
prior to etching the opposite first ends of the channel layer, forming inner spacers on opposite third ends of the first sacrificial layer.

11. The method of claim 10, wherein forming the first dummy spacers on the etched opposite first ends of the channel layer is performed such that the first dummy spacers is in contact with the inner spacers.

12. The method of claim 10, wherein forming the first dummy spacers on the etched opposite first ends of the channel layer is performed such that the first dummy spacers have a sidewall aligned with a sidewall of the inner spacers.

13. The method of claim 10, wherein one of the first dummy spacers has a horizontal width different from a horizontal width of one of the inner spacers.

14. The method of claim 10, wherein one of the first dummy spacers has a horizontal width smaller than a horizontal width of one of the inner spacers.

15. The method of claim 10, wherein the metal gate structure is in contact with a top surface of the inner spacers.

16. A method comprising:
forming a stack over a semiconductor substrate, wherein the stack comprises a first sacrificial layer, an epitaxial layer over the first sacrificial layer, and a second sacrificial layer over the epitaxial layer, the first sacrificial layer and the second sacrificial layer comprise a first composition, the epitaxial layer comprise a second composition different from the first composition;
patterning the stack into a fin structure such that opposite first ends of the epitaxial layer are exposed;
recessing the opposite first ends of the epitaxial layer;
forming first dummy spacers on the recessed opposite first ends of the epitaxial layer;
forming an isolation structure in the fin structure;
recessing a top surface of the isolation structure to a position lower than a bottom surface of the epitaxial layer, such that opposite second ends of the epitaxial layer are exposed;
recessing the opposite second ends of the epitaxial layer;
forming second dummy spacers on the recessed opposite second ends of the epitaxial layer; and replacing the first dummy spacers and the second dummy spacers with a metal gate structure.

17. The method of claim 16, further comprising:

after forming the first dummy spacers on the recessed opposite first ends of the epitaxial layer, forming a source/drain epitaxial structure over a top surface of the second sacrificial layer.

18. The method of claim 17, further comprising:

prior to recessing the opposite first ends of the epitaxial layer, forming inner spacers on opposite third ends of the second sacrificial layer.

19. The method of claim 18, further comprising:

after forming the inner spacers on the opposite third ends of the second sacrificial layer, forming a source/drain epitaxial structure vertically over a top surface of the second sacrificial layer.

20. The method of claim 19, wherein the source/drain epitaxial structure has a top surface higher than a topmost surface of the metal gate structure.

* * * * *